United States Patent
Do et al.

(10) Patent No.: US 8,513,788 B2
(45) Date of Patent: Aug. 20, 2013

(54) INTEGRATED CIRCUIT PACKAGING SYSTEM WITH PAD AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/326,173

(22) Filed: Dec. 14, 2011

(65) Prior Publication Data

US 2013/0154072 A1 Jun. 20, 2013

(51) Int. Cl.
*H01L 23/495* (2006.01)
*H01L 21/00* (2006.01)

(52) U.S. Cl.
USPC .............................. 257/676; 438/123; 438/124

(58) Field of Classification Search
USPC .................. 257/676, 678, 687, 690, 692, 693, 257/781, 782–784, 786, 787, E21.505, E23.031, 257/E21.504, E23.046, E23.047, E23.124; 438/123, 124
See application file for complete search history.

(56) References Cited

U.S. PATENT DOCUMENTS

| 6,498,099 | B1 | 12/2002 | McLellan et al. | |
|---|---|---|---|---|
| 8,035,207 | B2 | 10/2011 | Camacho et al. | |
| 2008/0308951 | A1 | 12/2008 | Li et al. | |
| 2010/0044878 | A1* | 2/2010 | Ha et al. ...................... | 257/777 |
| 2010/0224971 | A1 | 9/2010 | Li | |

OTHER PUBLICATIONS

U.S. Appl. No. 13/102,041, filed May 5, 2011, Do et al.

* cited by examiner

*Primary Examiner* — N Drew Richards
*Assistant Examiner* — Christina Sylvia
(74) *Attorney, Agent, or Firm* — Ishimaru & Associates LLP; I-Chang John Yang

(57) ABSTRACT

A method of manufacture of an integrated circuit packaging system includes: forming a peripheral lead having a peripheral lead bottom side, a peripheral lead top side, a peripheral lead non-horizontal side, and a peripheral lead horizontal ridge protruding from the peripheral lead non-horizontal side; forming a first top distribution layer on the peripheral lead top side; connecting an integrated circuit to the first top distribution layer; and applying an insulation layer directly on a distribution layer bottom extent of the first top distribution layer and a peripheral lead ridge lower side of the peripheral lead horizontal ridge with a cavity in the portion of the insulation layer directly below the integrated circuit.

20 Claims, 9 Drawing Sheets

US 8,513,788 B2

INTEGRATED CIRCUIT PACKAGING SYSTEM WITH PAD AND METHOD OF MANUFACTURE THEREOF

TECHNICAL FIELD

The present invention relates generally to an integrated circuit packaging system, and more particularly to a system for an integrated circuit packaging system with interconnection.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a peripheral lead having a peripheral lead bottom side, a peripheral lead top side, a peripheral lead non-horizontal side, and a peripheral lead horizontal ridge protruding from the peripheral lead non-horizontal side; forming a first top distribution layer on the peripheral lead top side; connecting an integrated circuit to the first top distribution layer; and applying an insulation layer directly on a distribution layer bottom extent of the first top distribution layer and a peripheral lead ridge lower side of the peripheral lead horizontal ridge with a cavity in the portion of the insulation layer directly below the integrated circuit.

The present invention provides an integrated circuit packaging system, including: a peripheral lead having a peripheral lead bottom side, a peripheral lead top side, a peripheral lead non-horizontal side, and a peripheral lead horizontal ridge protruding from the peripheral lead non-horizontal side; a first top distribution layer on the peripheral lead top side; an integrated circuit connected to the first top distribution layer; and an insulation layer directly on a distribution layer bottom extent of the first top distribution layer and a peripheral lead ridge lower side of the peripheral lead horizontal ridge with a cavity in the portion of the insulation layer directly below the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
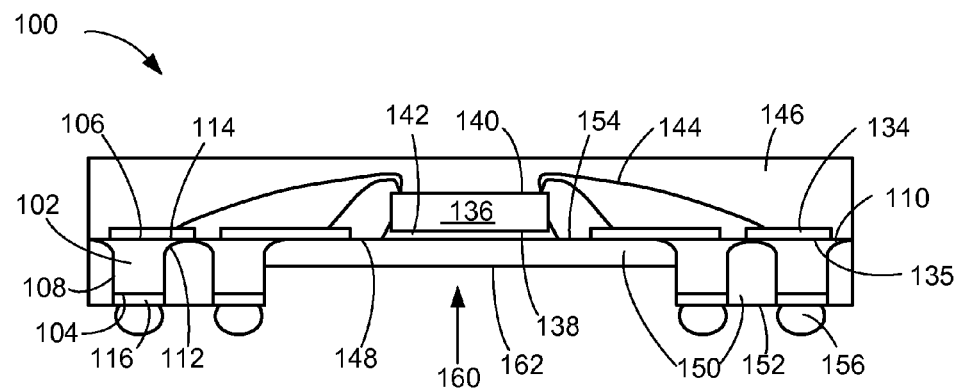
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the "active side" of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Quad Flat No-Lead Stand-off Terminal (QFNs-st) multi-row packages have a problem with long wire spans and difficult wire-crossings. Longer wire span causes more wire usage and high cost of assembly. Due to complexity of bonding layout, another problem can occur with larger package sizes for Quad Flat No-Lead Stand-off Terminal (QFNs-st) packages require more expensive mold system. Embodiments of the present invention provide solutions or answers to the problem.

Figure 2:
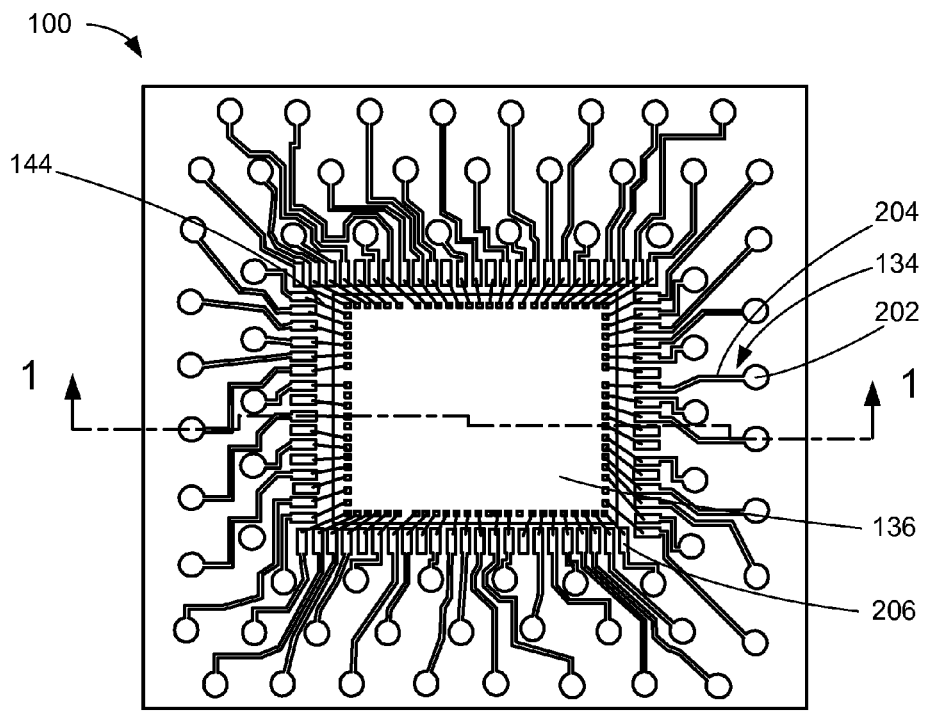
FIG. 2 is a first exemplary top plan view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a quad flat no-lead (QFN) array.

The integrated circuit packaging system 100 can include a peripheral lead 102, which is defined as a structure that provides connectivity for electrical signals or electrical potential levels between the integrated circuit packaging system 100 and an external system (not shown). The integrated circuit packaging system 100 can include a plurality of the peripheral lead 102. For example, the peripheral lead 102 can represent an interconnection including a terminal or a pad.

The peripheral lead 102 can include a peripheral lead bottom side 104 and a peripheral lead top side 106 opposite the peripheral lead bottom side 104. The peripheral lead bottom side 104 and the peripheral lead top side 106 are defined as bottom and top sides, respectively, of the peripheral lead 102. The peripheral lead 102 can include a peripheral lead non-horizontal side 108 extending between the peripheral lead bottom side 104 and the peripheral lead top side 106.

The peripheral lead 102 can include a peripheral lead horizontal ridge 110, which is defined as an end of the peripheral lead 102 that horizontally protrudes from the peripheral lead non-horizontal side 108. The peripheral lead horizontal ridge 110 can extend from the peripheral lead top side 106. The peripheral lead horizontal ridge 110 can include a peripheral lead ridge lower side 112 and a peripheral lead ridge upper side 114 above the peripheral lead ridge lower side 112.

A plane of the peripheral lead ridge upper side 114 can be coplanar with a plane of the peripheral lead top side 106. A plane of the peripheral lead non-horizontal side 108 can intersect planes of the peripheral lead ridge upper side 114 and the peripheral lead top side 106. An intersection of a plane of the peripheral lead non-horizontal side 108 and planes of the peripheral lead ridge upper side 114 and the peripheral lead top side 106 can represent a dividing line or a boundary between the peripheral lead ridge upper side 114 and the peripheral lead top side 106.

For example, the peripheral lead ridge lower side 112 can include any surface including a curve surface or any non-planar surface. Also for example, the peripheral lead ridge upper side 114 can include any surface including a flat surface or any planar surface.

The peripheral lead 102 can include a peripheral lead conductive plate 116, which is defined as an attachment site providing electrical connection to the peripheral lead 102. The peripheral lead conductive plate 116 can function as an etching protection layer, an adhesion layer, a buffer diffusion barrier layer, a wet-enhancing layer, or a combination thereof.

The peripheral lead conductive plate 116 can be formed at the peripheral lead bottom side 104. Optionally, a bottom terminal, shown as the peripheral lead 102, can be plated or can be bare copper (Cu) depending on the application.

As an example, the peripheral lead conductive plate 116 can be formed with bottom plating process on a terminal. The peripheral lead conductive plate 116 can be formed with a conductive material, such as gold, palladium, nickel, silver, tin, an alloy, or a combination thereof. The peripheral lead conductive plate 116 can be formed from a material different than the material used to form the peripheral lead 102.

The integrated circuit packaging system 100 can include a first top distribution layer 134, which is defined as a structure that provides electrical connectivity between a semiconductor device and the peripheral lead 102. The first top distribution layer 134 routes electrical connection or redistributes electrical signals from an integrated circuit 136 to the peripheral lead 102.

The integrated circuit 136 is defined as a semiconductor device. For example, the integrated circuit 136 can include a semiconductor device including a wirebond chip, a flip chip, or a silicon (Si) die. Optionally, the integrated circuit packaging system 100 can include the integrated circuit 136 in a stacked configuration having more than one of the integrated circuit 136, such as a wirebond die stacked or mounted on a flip-chip die.

The integrated circuit 136 can include an inactive side 138 and an active side 140 opposite the inactive side 138. The active side 140 can have active circuitry (not shown) fabricated thereon. An attach layer 142, which is defined as a die attach material or an adhesive material, can be along the inactive side 138.

The integrated circuit packaging system 100 can include a plurality of the first top distribution layer 134. For example, the first top distribution layer 134 can represent an electrical connector including a top plate with a routed circuit or a distribution layer (RDL). Also for example, the first top distribution layer 134 can include a flat top.

The first top distribution layer 134 can be electrically connected to the peripheral lead 102. The first top distribution layer 134 can be formed directly on a portion of the peripheral lead top side 106.

The integrated circuit 136 can be between the peripheral lead 102 and another of the peripheral lead 102. The integrated circuit 136 can be surrounded by an array of a plurality of the peripheral lead 102. The peripheral lead 102 can surround a periphery of the integrated circuit 136.

The integrated circuit packaging system 100 can include an internal connector 144, which is defined as an electrically conductive connector connected or attached to the first top distribution layer 134 and the active side 140. The integrated circuit packaging system 100 can include a plurality of the internal connector 144. For example, the internal connector 144 can represent an electrical connector including a wire interconnect, a bond wire, or a conductive bump.

The integrated circuit packaging system 100 can include an encapsulation 146, which is defined as a package cover of a semiconductor package to seal a semiconductor device providing mechanical and environmental protection. The encapsulation 146 can be formed covering or over the peripheral lead top side 106, the first top distribution layer 134, the integrated circuit 136, the attach layer 142, and the internal connector 144.

The encapsulation 146 can include an encapsulation bottom side 148. A plane of the encapsulation bottom side 148 can be coplanar with any one of planes of the peripheral lead top side 106 and a distribution layer bottom extent 135 of the first top distribution layer 134.

The integrated circuit packaging system 100 can include an insulation layer 150, which is defined as a protection layer that protects a portion of the distribution layer bottom extent 135 of the first top distribution layer 134. The insulation layer 150 can include an insulation material including a passivation, a solder resist, or an adhesive. For example, the insulation layer 150 can be a viscous material that hardens when cured, or a material different from the encapsulation 146.

The insulation layer 150 can be formed or applied directly on portions of the peripheral lead 102, the first top distribution layer 134, and the encapsulation 146. The insulation layer 150 can be formed or applied directly on the peripheral lead non-horizontal side 108, the peripheral lead ridge lower side 112, the distribution layer bottom extent 135 of the first top distribution layer 134, and the encapsulation bottom side 148.

The insulation layer 150 can electrically isolate the peripheral lead 102 from another of the peripheral lead 102. The insulation layer 150 can be formed surrounding the peripheral lead 102. The insulation layer 150 can electrically isolate the first top distribution layer 134 from another of the first top distribution layer 134.

The insulation layer 150 can include an insulation bottom side 152 and an insulation top side 154 opposite the insulation bottom side 152. A plane of the insulation bottom side 152 can be coplanar with any one of planes of the peripheral lead bottom side 104. For example, a plane of the insulation bottom side 152 can be coplanar with any one of planes of a bottom extent of the peripheral lead conductive plate 116. A plane of the insulation top side 154 can be coplanar with any one of planes of the peripheral lead ridge upper side 114.

For illustrative purposes, a plane of the insulation bottom side 152 is shown coplanar with planes of the peripheral lead bottom side 104, although it is understood that a plane of the insulation bottom side 152 can be non-coplanar with any one of planes of the peripheral lead bottom side 104. For example, a plane of the insulation bottom side 152 can be lower or below any of planes of the peripheral lead bottom side 104.

The insulation layer 150 can include a cavity 160 can be along the insulation bottom side 152. The cavity 160 can be in the portion of the insulation layer 150 directly below the integrated circuit 136. The cavity 160 can be between the peripheral lead 102 and another of the peripheral lead 102 both adjacent to the integrated circuit 136.

The cavity 160 can have a recessed surface 162. The vertical distance between the recessed surface 162 and the insulation top side 154 is less than the distance between the insulation bottom side 152 and the insulation top side 154.

The cavity 160 can have a horizontal dimension and vertical dimension sized to receive a packaged device. For example, the distance between the recessed surface 162 of the cavity 160 and the insulation bottom side 152 can be similar or greater than the vertical length or height of a packaged device.

The integrated circuit packaging system 100 can include an external connector 156, which is defined as an electrically conductive connector connected or attached to the peripheral lead conductive plate 116 and the external system. The integrated circuit packaging system 100 can include a plurality of the external connector 156.

For example, the external connector 156 can represent an electrical connector including a conductive ball. Also for example, the external connector 156 can be formed with a conductive material including solder, a metal, or a metallic alloy. For a specific example, the external connector 156 can represent a solder ball for enhancing board level reliability (BLR) performance.

The integrated circuit packaging system 100 can include a multi-row lead frame with circuit routing. Bottom terminal can be plated, as shown with the peripheral lead 102 having the peripheral lead conductive plate 116, to protect from etching process as a way of forming individual terminals. A coating of a protective material or layer, as shown with the insulation layer 150, can be applied for protection or security of circuit or trace, as shown with the first top distribution layer 134 for example. The insulation layer 150 can be provided for protections from chemical etch out after assembly or undesired environmental conditions.

It has been discovered that the first top distribution layer 134 connected to the peripheral lead 102 and the integrated circuit 136 provides wire span reduction as well as package size reduction, cost savings, and elimination of complex bond layout.

It has been unexpectedly found that the peripheral lead 102 having the peripheral lead horizontal ridge 110 covered by the insulation layer 150 improves interlocking of the peripheral lead 102 or terminal by eliminating lead pullouts.

It has been unexpectedly ascertained that the insulation layer 150 improves reliability by isolating the first top distribution layer 134 from another of the first top distribution layer 134 or the peripheral lead 102 from another of the peripheral lead 102 thereby eliminating solder creep or electrical shorts.

It has further been discovered that the cavity 160 in the insulation layer 150 reduces height of stacked package systems by providing a space for other devices.

It has also been discovered that the cavity 160 provides reduced thickness of the insulation layer 150 for facilitating heat transfer of the integrated circuit 136 to the external environment.

Referring now to FIG. 2, therein is shown a first exemplary top plan view of the integrated circuit packaging system 100. The first exemplary top plan view is shown without the encapsulation 146 of FIG. 1.

The first top distribution layer 134 can include a first top terminal 202, which is defined as an electrical connection site providing electrical connectivity to the first top distribution layer 134. The first top terminal 202 can be directly on the peripheral lead top side 106 of FIG. 1.

An array of a plurality of the first top terminal 202 can be distributed across surfaces at the peripheral lead top side 106. The array is defined as a physical arrangement or distribution of the plurality of the first top terminal 202 over a surface area of the peripheral lead top side 106. The array includes the plurality of the first top terminal 202 that is fully populated, evenly spaced, or a combination thereof. The array can be outside of a perimeter of the integrated circuit 136.

The first top distribution layer 134 can include a first top conductive trace 204, which is defined as a conductive connector that provides or routes electrical connection between the first top terminal 202 and a first top finger 206. The first top finger 206 is defined as an electrical connection site for the internal connector 144 to attach to the first top distribution layer 134.

The first top conductive trace 204 can be directly on portions of the peripheral lead 102. The first top conductive trace 204 can be directly on portions of the peripheral lead ridge upper side 114 of FIG. 1. For example, the first top conductive trace 204 can include an electrical connector including a distribution trace or a routed layer.

An array of a plurality of the first top finger 206 can be formed adjacent to or surrounding a perimeter of the integrated circuit 136. The array is defined as a physical arrangement or distribution of the plurality of the first top finger 206. The array includes a row of the plurality of the first top finger 206. The array can include the plurality of the first top finger 206 that is evenly spaced.

For illustrative purposes, the first top terminal 202 and the first top finger 206 are shown having circular and rectangular shapes, respectively, although it is understood that the first top terminal 202 and the first top finger 206 can include any shapes. For example, the first top finger 206 can include a circular shape.

Figure 3:
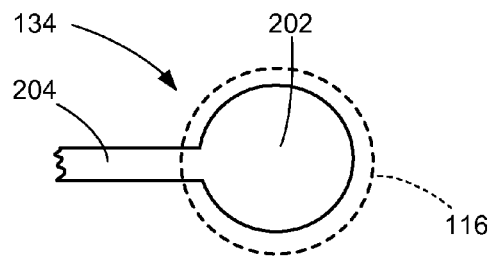
FIG. 3 is a top view of a portion of the first top distribution layer of FIG. 1.

Referring now to FIG. 3, therein is shown a top view of a portion of the first top distribution layer 134 of FIG. 1. The first top distribution layer 134 can include the first top conductive trace 204 electrically connected to the first top terminal 202. The first top terminal 202 can include a surface area smaller than a surface area of the peripheral lead conductive plate 116.

The first top distribution layer 134 can include the first top terminal 202, the first top conductive trace 204, and the first top finger 206 of FIG. 2 formed as a single integral structure with a common electrically conductive material. The first top conductive trace 204 can be electrically connected to the first top terminal 202 and the first top finger 206.

Figure 4:
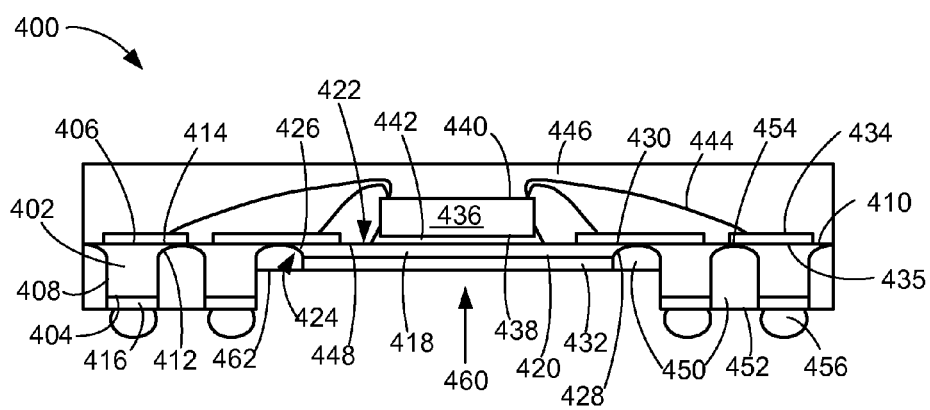
FIG. 4 is a cross-sectional view of an integrated circuit packaging system as exemplified by line 1-1 of FIG. 2 in a second embodiment of the present invention.

Referring now to FIG. 4, therein is shown a cross-sectional view of an integrated circuit packaging system 400 as exemplified by line 1-1 of FIG. 2 in a second embodiment of the present invention. The integrated circuit packaging system 400 can include a quad flat no-lead (QFN) array.

The integrated circuit packaging system 400 can include a peripheral lead 402, which is defined as a structure that provides connectivity for electrical signals or electrical potential levels between the integrated circuit packaging system 400 and an external system (not shown). The integrated circuit packaging system 400 can include a plurality of the peripheral lead 402. For example, the peripheral lead 402 can represent an interconnection including a terminal or a pad.

The peripheral lead 402 can include a peripheral lead bottom side 404 and a peripheral lead top side 406 opposite the peripheral lead bottom side 404. The peripheral lead bottom side 404 and the peripheral lead top side 406 are defined as bottom and top sides, respectively, of the peripheral lead 402. The peripheral lead 402 can include a peripheral lead non-horizontal side 408 extending between the peripheral lead bottom side 404 and the peripheral lead top side 406.

The peripheral lead 402 can include a peripheral lead horizontal ridge 410, which is defined as an end of the peripheral lead 402 that horizontally protrudes from the peripheral lead non-horizontal side 408. The peripheral lead horizontal ridge 410 can extend from the peripheral lead top side 406. The peripheral lead horizontal ridge 410 can include a peripheral lead ridge lower side 412 and a peripheral lead ridge upper side 414 above the peripheral lead ridge lower side 412.

A plane of the peripheral lead ridge upper side 414 can be coplanar with a plane of the peripheral lead top side 406. A plane of the peripheral lead non-horizontal side 408 can intersect planes of the peripheral lead ridge upper side 414 and the peripheral lead top side 406. An intersection of a plane of the peripheral lead non-horizontal side 408 and planes of the peripheral lead ridge upper side 414 and the peripheral lead top side 406 can represent a dividing line or a boundary between the peripheral lead ridge upper side 414 and the peripheral lead top side 406.

For example, the peripheral lead ridge lower side 412 can include any surface including a curve surface or any non-planar surface. Also for example, the peripheral lead ridge upper side 414 can include any surface including a flat surface or any planar surface.

The peripheral lead 402 can include a peripheral lead conductive plate 416, which is defined as an attachment site providing electrical connection to the peripheral lead 402. The peripheral lead conductive plate 416 can function as an etching protection layer, an adhesion layer, a buffer diffusion barrier layer, a wet-enhancing layer, or a combination thereof.

The peripheral lead conductive plate 416 can be formed at the peripheral lead bottom side 404. Optionally, a bottom terminal, shown as the peripheral lead 402, can be plated or can be bare copper (Cu) depending on the application.

As an example, the peripheral lead conductive plate 416 can be formed with bottom plating process on a terminal. The peripheral lead conductive plate 416 can be formed with a conductive material, such as gold, palladium, nickel, silver, tin, an alloy, or a combination thereof. The peripheral lead conductive plate 416 can be formed from a material different than the material used to form the peripheral lead 402.

The integrated circuit packaging system 400 can include a package paddle 418, which is defined as a support structure for mounting a semiconductor thereon. The package paddle 418 can include a paddle bottom side 420 and a paddle top side 422 opposite the paddle bottom side 420. The paddle bottom side 420 and the paddle top side 422 are defined as bottom and top sides of the package paddle 418. The package paddle 418 can include a paddle non-horizontal side 424 extending between the paddle bottom side 420 and the paddle top side 422.

The package paddle 418 can include a paddle horizontal ridge 426, which is defined as an end of the package paddle 418 that horizontally protrudes from the paddle non-horizontal side 424. The paddle horizontal ridge 426 can extend from the paddle top side 422. The paddle horizontal ridge 426 can include a paddle ridge lower side 428 and a paddle ridge upper side 430 above the paddle ridge lower side 428.

A plane of the paddle ridge upper side 430 can be coplanar with a plane of the paddle top side 422. A plane of the paddle non-horizontal side 424 can intersect planes of the paddle ridge upper side 430 and the paddle top side 422. An intersection of a plane of the paddle non-horizontal side 424 and planes of the paddle ridge upper side 430 and the paddle top side 422 can represent a dividing line or a boundary between the paddle ridge upper side 430 and the paddle top side 422.

For example, the paddle ridge lower side 428 can include any surface including a curve surface or any non-planar surface. Also for example, the paddle ridge upper side 430 can include any surface including a flat surface or any planar surface.

The package paddle 418 can include a paddle conductive plate 432, which is defined as an attachment site providing electrical connection to the package paddle 418. The paddle conductive plate 432 can function as an etching protection layer, an adhesion layer, a buffer diffusion barrier layer, a wet-enhancing layer, or a combination thereof.

The paddle conductive plate 432 can be formed at the paddle bottom side 420. As an example, the paddle conductive plate 432 can be formed with bottom plating process on a terminal. The paddle conductive plate 432 can be formed with a conductive material, such as gold, palladium, nickel, silver, tin, an alloy, a combination thereof, or a material similar to the material used to form the peripheral lead conductive plate 416. The paddle conductive plate 432 can be formed from a material different than the material used to form the package paddle 418.

The integrated circuit packaging system 400 can include a first top distribution layer 434, which is defined as a structure that provides electrical connectivity between a semiconductor device and the peripheral lead 402. The first top distribution layer 434 routes electrical connection or redistributes electrical signals from an integrated circuit 436 to the peripheral lead 402.

The integrated circuit 436 is defined as a semiconductor device. For example, the integrated circuit 436 can include a semiconductor device including a wirebond chip, a flip chip, or a silicon (Si) die. Optionally, the integrated circuit packaging system 400 can include the integrated circuit 436 in a stacked configuration having more than one of the integrated circuit 436, such as a wirebond die stacked or mounted on a flip-chip die.

The integrated circuit 436 can include an inactive side 438 and an active side 440 opposite the inactive side 438. The active side 440 can have active circuitry (not shown) fabricated thereon.

The integrated circuit packaging system 400 can include a plurality of the first top distribution layer 434. For example, the first top distribution layer 434 can represent an electrical connector including a top plate with a routed circuit or a distribution layer (RDL). Also for example, the first top distribution layer 434 can include a flat top.

The first top distribution layer 434 can be electrically connected to the peripheral lead 402. The first top distribution layer 434 can be formed directly on a portion of the peripheral lead top side 406, a portion of the paddle top side 422, or a combination thereof.

The integrated circuit 436 can include the inactive side 438 facing the paddle top side 422. The integrated circuit 436 can be mounted over the paddle top side 422 with an attach layer 442, which is defined as a die attach material or an adhesive material. The attach layer 442 can be attached to the paddle top side 422 and the inactive side 438.

The integrated circuit 436 can be between the peripheral lead 402 and another of the peripheral lead 402. The integrated circuit 436 can be surrounded by an array of a plurality of the peripheral lead 402. The peripheral lead 402 can surround a periphery of the integrated circuit 436.

The integrated circuit packaging system 400 can include an internal connector 444, which is defined as an electrically conductive connector connected or attached to the first top distribution layer 434 and the active side 440. The integrated circuit packaging system 400 can include a plurality of the internal connector 444. For example, the internal connector 444 can represent an electrical connector including a wire interconnect, a bond wire, or a conductive bump.

The integrated circuit packaging system 400 can include an encapsulation 446, which is defined as a package cover of a semiconductor package to seal a semiconductor device providing mechanical and environmental protection. The encapsulation 446 can be formed covering or over the peripheral lead top side 406, the paddle top side 422, the first top distribution layer 434, the integrated circuit 436, the attach layer 442, and the internal connector 444.

The encapsulation 446 can include an encapsulation bottom side 448. A plane of the encapsulation bottom side 448 can be coplanar with any one of planes of the peripheral lead top side 406, the paddle top side 422, and a distribution layer bottom extent 435 of the first top distribution layer 434.

The integrated circuit packaging system 400 can include an insulation layer 450, which is defined as a protection layer that protects a portion of the distribution layer bottom extent 435 of the first top distribution layer 434. The insulation layer 450 can include an insulation material including a passivation layer, a solder resist, or an adhesive. For example, the insulation layer 450 can be a viscous material that hardens when cured, or a material different from the encapsulation 446.

The insulation layer 450 can be formed or applied directly on portions of the peripheral lead 402, the package paddle 418, the first top distribution layer 434, and the encapsulation 446. The insulation layer 450 can be formed or applied directly on the peripheral lead non-horizontal side 408, the peripheral lead ridge lower side 412, the paddle non-horizontal side 424, the paddle ridge lower side 428, a horizontal extent of the paddle conductive plate 432, the distribution layer bottom extent 435 of the first top distribution layer 434, and the encapsulation bottom side 448.

The insulation layer 450 can electrically isolate the peripheral lead 402 from another of the peripheral lead 402 or the peripheral lead 402 from the package paddle 418. The insulation layer 450 can be formed surrounding the peripheral lead 402 and the package paddle 418. The insulation layer 450 can electrically isolate the first top distribution layer 434 from another of the first top distribution layer 434.

The insulation layer 450 can include an insulation bottom side 452 and an insulation top side 454 opposite the insulation bottom side 452. A plane of the insulation bottom side 452 can be coplanar with any one of planes of the peripheral lead bottom side 404 and the paddle bottom side 420. For example, a plane of the insulation bottom side 452 can be coplanar with any one of planes of a bottom extent of the peripheral lead conductive plate 416 and a bottom extent of the paddle conductive plate 432. A plane of the insulation top side 454 can be coplanar with any one of planes of the peripheral lead ridge upper side 414 and the paddle ridge upper side 430.

For illustrative purposes, a plane of the insulation bottom side 452 is shown coplanar with planes of the peripheral lead bottom side 404 and the paddle bottom side 420, although it is understood that a plane of the insulation bottom side 452 can be non-coplanar with any one of planes of the peripheral lead bottom side 404 and the paddle bottom side 420. For example, a plane of the insulation bottom side 452 can be lower or below any of planes of the peripheral lead bottom side 404 and the paddle bottom side 420.

The insulation layer 450 can include a cavity 460 can be along the insulation bottom side 452. The cavity 460 can be in the portion of the insulation layer 450 directly below the integrated circuit 436. The cavity 460 can be between the peripheral lead 402 and another of the peripheral lead 402 both adjacent to the integrated circuit 436.

The cavity 460 can have a recessed surface 462. The vertical distance between the recessed surface 462 and the insulation top side 454 is less than the distance between the insulation bottom side 452 and the insulation top side 454.

The package paddle 418 can be exposed in the cavity 460 along the recessed surface 462. The recessed surface 462 can be co-planar with the side of the paddle conductive plate 432 facing away from the paddle bottom side 420.

The cavity 460 can have a horizontal dimension and vertical dimension sized to receive a packaged device. For example, the distance between the recessed surface 462 of the cavity 460 and the insulation bottom side 452 can be similar or greater than the vertical length or height of a packaged device.

The integrated circuit packaging system 400 can include an external connector 456, which is defined as an electrically conductive connector connected or attached to the peripheral lead conductive plate 416 and the external system. The integrated circuit packaging system 400 can include a plurality of the external connector 456.

For example, the external connector 456 can represent an electrical connector including a conductive ball. Also for example, the external connector 456 can be formed with a conductive material including solder, a metal, or a metallic alloy. For a specific example, the external connector 456 can represent a solder ball for enhancing board level reliability (BLR) performance.

The integrated circuit packaging system 400 can include a multi-row lead frame with circuit routing. Bottom terminal can be plated, as shown with the peripheral lead 402 having the peripheral lead conductive plate 416, to protect from etching process as a way of forming individual terminals. A coating of a protective material or layer, as shown with the insulation layer 450, can be applied for protection or security of circuit or trace, as shown with the first top distribution layer 434 for example. The insulation layer 450 can be provided for protections from chemical etch out after assembly or undesired environmental conditions.

It has been discovered that the insulation bottom side 452 coplanar with the peripheral lead bottom side 404 and the paddle bottom side 420 provides protection for the peripheral lead 402 and the package paddle 418 thereby providing improved reliability.

It has been also discovered that the first top distribution layer 434 connected to the peripheral lead 402 and the integrated circuit 436 provides wire span reduction as well as package size reduction, cost savings, and elimination of complex bond layout.

It has been unexpectedly found that the peripheral lead 402 having the peripheral lead horizontal ridge 410 covered by the insulation layer 450 improves interlocking of the peripheral lead 402 or terminal by eliminating lead pullouts.

It has been unexpectedly ascertained that the insulation layer 450 improves reliability by isolating the first top distribution layer 434 from another of the first top distribution layer 434 or the peripheral lead 402 from another of the peripheral lead 402 thereby eliminating solder creep or electrical shorts.

It has further been discovered that the cavity 460 in the insulation layer 450 reduces height of stacked package systems by providing a space for other devices.

It has also been discovered that the cavity 460 provides reduced thickness of the insulation layer 450 for facilitating heat transfer of the integrated circuit 436 to the external environment.

Figure 5:
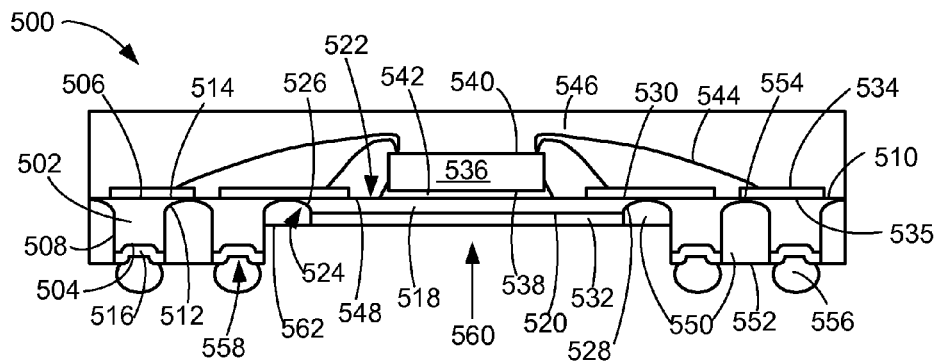
FIG. 5 is a cross-sectional view of an integrated circuit packaging system as exemplified by line 1-1 of FIG. 2 in a third embodiment of the present invention.

Referring now to FIG. 5, therein is shown a cross-sectional view of an integrated circuit packaging system 500 as exemplified by line 1-1 of FIG. 2 in a third embodiment of the present invention. The integrated circuit packaging system 500 can include a quad flat no-lead (QFN) array.

The integrated circuit packaging system 500 can include a peripheral lead 502, which is defined as a structure that provides connectivity for electrical signals or electrical potential levels between the integrated circuit packaging system 500 and an external system (not shown). The integrated circuit packaging system 500 can include a plurality of the peripheral lead 502. For example, the peripheral lead 502 can represent an interconnection including a terminal or a pad.

The peripheral lead 502 can include a peripheral lead bottom side 504 and a peripheral lead top side 506 opposite the peripheral lead bottom side 504. The peripheral lead bottom side 504 and the peripheral lead top side 506 are defined as bottom and top sides, respectively, of the peripheral lead 502. The peripheral lead 502 can include a peripheral lead non-horizontal side 508 extending between the peripheral lead bottom side 504 and the peripheral lead top side 506.

The peripheral lead 502 can include a peripheral lead horizontal ridge 510, which is defined as an end of the peripheral lead 502 that horizontally protrudes from the peripheral lead non-horizontal side 508. The peripheral lead horizontal ridge 510 can extend from the peripheral lead top side 506. The peripheral lead horizontal ridge 510 can include a peripheral lead ridge lower side 512 and a peripheral lead ridge upper side 514 above the peripheral lead ridge lower side 512.

A plane of the peripheral lead ridge upper side 514 can be coplanar with a plane of the peripheral lead top side 506. A plane of the peripheral lead non-horizontal side 508 can intersect planes of the peripheral lead ridge upper side 514 and the peripheral lead top side 506. An intersection of a plane of the peripheral lead non-horizontal side 508 and planes of the peripheral lead ridge upper side 514 and the peripheral lead top side 506 can represent a dividing line or a boundary between the peripheral lead ridge upper side 514 and the peripheral lead top side 506.

For example, the peripheral lead ridge lower side 512 can include any surface including a curve surface or any non-planar surface. Also for example, the peripheral lead ridge upper side 514 can include any surface including a flat surface or any planar surface.

The peripheral lead 502 can include a peripheral lead conductive plate 516, which is defined as an attachment site providing electrical connection to the peripheral lead 502. The peripheral lead conductive plate 516 can function as an etching protection layer, an adhesion layer, a buffer diffusion barrier layer, a wet-enhancing layer, or a combination thereof.

The peripheral lead conductive plate 516 can be formed at the peripheral lead bottom side 504. Optionally, a bottom terminal, shown as the peripheral lead 502, can be plated or can be bare copper (Cu) depending on the application.

As an example, the peripheral lead conductive plate 516 can be formed with bottom plating process on a terminal. The peripheral lead conductive plate 516 can be formed with a conductive material, such as gold, palladium, nickel, silver, tin, an alloy, or a combination thereof. The peripheral lead conductive plate 516 can be formed from a material different than the material used to form the peripheral lead 502.

The peripheral lead conductive plate 516 can include a recess 558 at the peripheral lead bottom side 504. For example, the peripheral lead 502 can include a ball catch structure, shown as the peripheral lead conductive plate 516 having the recess 558, such that solder ball and printing method is adaptable providing locking enhancement for board level reliability improvement. The ball catch structure is defined as a structure having the peripheral lead conductive plate 516 with the recess 558 to provide a reliable connection site to attach the connectors to the peripheral lead 502.

The integrated circuit packaging system 500 can include a package paddle 518, which is defined as a support structure for mounting a semiconductor thereon. The package paddle 518 can include a paddle bottom side 520 and a paddle top side 522 opposite the paddle bottom side 520. The paddle bottom side 520 and the paddle top side 522 are defined as bottom and top sides of the package paddle 518. The package paddle 518 can include a paddle non-horizontal side 524 extending between the paddle bottom side 520 and the paddle top side 522.

For illustrative purposes, the integrated circuit packaging system 500 is shown having the package paddle 518, although it is understood that the package paddle 518 is optional. For example, the integrated circuit packaging system 500 can be formed without the package paddle 518 between the peripheral lead 502 and a further one of the peripheral lead 502 as shown in the integrated circuit packaging system 100 of FIG. 1.

The package paddle 518 can include a paddle horizontal ridge 526, which is defined as an end of the package paddle 518 that horizontally protrudes from the paddle non-horizontal side 524. The paddle horizontal ridge 526 can extend from the paddle top side 522. The paddle horizontal ridge 526 can include a paddle ridge lower side 528 and a paddle ridge upper side 530 above the paddle ridge lower side 528.

A plane of the paddle ridge upper side 530 can be coplanar with a plane of the paddle top side 522. A plane of the paddle non-horizontal side 524 can intersect planes of the paddle ridge upper side 530 and the paddle top side 522. An intersection of a plane of the paddle non-horizontal side 524 and planes of the paddle ridge upper side 530 and the paddle top side 522 can represent a dividing line or a boundary between the paddle ridge upper side 530 and the paddle top side 522.

For example, the paddle ridge lower side 528 can include any surface including a curve surface or any non-planar surface. Also for example, the paddle ridge upper side 530 can include any surface including a flat surface or any planar surface.

The package paddle 518 can include a paddle conductive plate 532, which is defined as an attachment site providing electrical connection to the package paddle 518. The paddle conductive plate 532 can function as an etching protection layer, an adhesion layer, a buffer diffusion barrier layer, a wet-enhancing layer, or a combination thereof.

The paddle conductive plate 532 can be formed at the paddle bottom side 520. As an example, the paddle conductive plate 532 can be formed with bottom plating process on a terminal. The paddle conductive plate 532 can be formed with a conductive material, such as gold, palladium, nickel, silver, tin, an alloy, a combination thereof, or a material similar to the material used to form the peripheral lead conductive plate 516. The paddle conductive plate 532 can be formed from a material different than the material used to form the package paddle 518.

The integrated circuit packaging system 500 can include a first top distribution layer 534, which is defined as a structure that provides electrical connectivity between a semiconductor device and the peripheral lead 502. The first top distribution layer 534 routes electrical connection or redistributes electrical signals from an integrated circuit 536 to the peripheral lead 502.

The integrated circuit 536 is defined as a semiconductor device. For example, the integrated circuit 536 can include a semiconductor device including a wirebond chip, a flip chip, or a silicon (Si) die. Optionally, the integrated circuit packaging system 500 can include the integrated circuit 536 in a stacked configuration having more than one of the integrated circuit 536, such as a wirebond die stacked or mounted on a flip-chip die.

The integrated circuit 536 can include an inactive side 538 and an active side 540 opposite the inactive side 538. The active side 540 can have active circuitry (not shown) fabricated thereon.

The integrated circuit packaging system 500 can include a plurality of the first top distribution layer 534. For example, the first top distribution layer 534 can represent an electrical connector including a top plate with a routed circuit or a distribution layer (RDL). Also for example, the first top distribution layer 534 can include a flat top.

The first top distribution layer 534 can be electrically connected to the peripheral lead 502. The first top distribution layer 534 can be formed directly on a portion of the peripheral lead top side 506, a portion of the paddle top side 522, or a combination thereof.

The integrated circuit 536 can include the inactive side 538 facing the paddle top side 522. The integrated circuit 536 can be mounted over the paddle top side 522 with an attach layer 542, which is defined as a die attach material or an adhesive material. The attach layer 542 can be attached to the paddle top side 522 and the inactive side 538.

The integrated circuit 536 can be between the peripheral lead 502 and another of the peripheral lead 502. The integrated circuit 536 can be surrounded by an array of a plurality of the peripheral lead 502. The peripheral lead 502 can surround a periphery of the integrated circuit 536.

The integrated circuit packaging system 500 can include an internal connector 544, which is defined as an electrically conductive connector connected or attached to the first top distribution layer 534 and the active side 540. The integrated circuit packaging system 500 can include a plurality of the internal connector 544. For example, the internal connector 544 can represent an electrical connector including a wire interconnect, a bond wire, or a conductive bump.

The integrated circuit packaging system 500 can include an encapsulation 546, which is defined as a package cover of a semiconductor package to seal a semiconductor device providing mechanical and environmental protection. The encapsulation 546 can be formed covering or over the peripheral lead top side 506, the paddle top side 522, the first top distribution layer 534, the integrated circuit 536, the attach layer 542, and the internal connector 544.

The encapsulation 546 can include an encapsulation bottom side 548. A plane of the encapsulation bottom side 548 can be coplanar with any one of planes of the peripheral lead top side 506, the paddle top side 522, and a distribution layer bottom extent 535 of the first top distribution layer 534.

The integrated circuit packaging system 500 can include an insulation layer 550, which is defined as a protection layer that protects a portion of the distribution layer bottom extent 535 of the first top distribution layer 534. The insulation layer 550 can include an insulation material including a passivation layer, a solder resist, or an adhesive. For example, the insulation layer 550 can be a viscous material that hardens when cured, or a material different from the encapsulation 546.

The insulation layer 550 can be formed or applied directly on portions of the peripheral lead 502, the package paddle 518, the first top distribution layer 534, and the encapsulation 546. The insulation layer 550 can be formed or applied directly on the peripheral lead non-horizontal side 508, the peripheral lead ridge lower side 512, the paddle non-horizontal side 524, the paddle ridge lower side 528, a horizontal extent of the paddle conductive plate 532, the distribution layer bottom extent 535 of the first top distribution layer 534, and the encapsulation bottom side 548.

The insulation layer 550 can electrically isolate the peripheral lead 502 from another of the peripheral lead 502 or the peripheral lead 502 from the package paddle 518. The insulation layer 550 can be formed surrounding the peripheral lead 502 and the package paddle 518. The insulation layer 550 can electrically isolate the first top distribution layer 534 from another of the first top distribution layer 534.

The insulation layer 550 can include an insulation bottom side 552 and an insulation top side 554 opposite the insulation bottom side 552. A plane of the insulation bottom side 552 can be coplanar with any one of planes of the peripheral lead bottom side 504 and the paddle bottom side 520. For example, a plane of the insulation bottom side 552 can be coplanar with any one of planes of a bottom extent of the peripheral lead conductive plate 516 and a bottom extent of the paddle conductive plate 532. A plane of the insulation top side 554 can be coplanar with any one of planes of the peripheral lead ridge upper side 514 and the paddle ridge upper side 530.

For illustrative purposes, a plane of the insulation bottom side 552 is shown coplanar with planes of the peripheral lead bottom side 504 and the paddle bottom side 520, although it is understood that a plane of the insulation bottom side 552 can be non-coplanar with any one of planes of the peripheral lead bottom side 504 and the paddle bottom side 520. For example, a plane of the insulation bottom side 552 can be lower or below any of planes of the peripheral lead bottom side 504 and the paddle bottom side 520.

The insulation layer 550 can include a cavity 560 can be along the insulation bottom side 552. The cavity 560 can be in the portion of the insulation layer 550 directly below the integrated circuit 536. The cavity 560 can be between the peripheral lead 502 and another of the peripheral lead 502 both adjacent to the integrated circuit 536.

The cavity 560 can have a recessed surface 562. The vertical distance between the recessed surface 562 and the insulation top side 554 is less than the distance between the insulation bottom side 552 and the insulation top side 554.

The package paddle 518 can be exposed in the cavity 560 along the recessed surface 562. The recessed surface 562 can be co-planar with the side of the paddle conductive plate 532 facing away from the paddle bottom side 520.

The cavity 560 can have a horizontal dimension and vertical dimension sized to receive a packaged device. For example, the distance between the recessed surface 562 of the cavity 560 and the insulation bottom side 552 can be similar or greater than the vertical length or height of a packaged device.

The integrated circuit packaging system 500 can include an external connector 556, which is defined as an electrically conductive connector connected or attached to the peripheral lead conductive plate 516 and the external system. The integrated circuit packaging system 500 can include a plurality of the external connector 556.

The external connector 556 can be attached to a bottom extent of the peripheral lead conductive plate 516 and within the recess 558. The external interconnector 556 can be optional in the ball catch configuration.

For example, the external connector 556 can represent an electrical connector including a conductive ball. Also for example, the external connector 556 can be formed with a conductive material including solder, a metal, or a metallic alloy. For a specific example, the external connector 556 can represent a solder ball for enhancing board level reliability (BLR) performance.

The integrated circuit packaging system 500 can include a multi-row lead frame with circuit routing. Bottom terminal can be plated, as shown with the peripheral lead 502 having the peripheral lead conductive plate 516, to protect from etching process as a way of forming individual terminals. A coating of a protective material or layer, as shown with the insulation layer 550, can be applied for protection or security of circuit or trace, as shown with the first top distribution layer 534 for example. The insulation layer 550 can be provided for protections from chemical etch out after assembly or undesired environmental conditions.

It has been discovered that the insulation bottom side 552 coplanar with the peripheral lead bottom side 504 and the paddle bottom side 520 provides protection for the peripheral lead 502 and the package paddle 518 thereby providing improved reliability.

It has been also discovered that the first top distribution layer 534 connected to the peripheral lead 502 and the integrated circuit 536 provides wire span reduction as well as package size reduction, cost savings, and elimination of complex bond layout.

It has been unexpectedly found that the peripheral lead 502 having the peripheral lead horizontal ridge 510 covered by the insulation layer 550 improves interlocking of the peripheral lead 502 or terminal by eliminating lead pullouts.

It has been unexpectedly ascertained that the insulation layer 550 improves reliability by isolating the first top distribution layer 534 from another of the first top distribution layer 534 or the peripheral lead 502 from another of the peripheral lead 502 thereby eliminating solder creep or electrical shorts.

It has been unexpectedly identified that the peripheral lead conductive plate 516 having the recess 558 provides a reliable electrical connection of the external connector 556 attached to the peripheral lead 502 and the external system.

It has further been discovered that the cavity 560 in the insulation layer 550 reduces height of stacked package systems by providing a space for other devices.

It has also been discovered that the cavity 560 provides reduced thickness of the insulation layer 550 for facilitating heat transfer of the integrated circuit 536 to the external environment.

It has been unexpectedly determined that the peripheral lead conductive plate 516 having the recess 558 provides a reliable connection site to attach the external connector 556 to the peripheral lead 502, thereby resulting in greater than 5% of board level reliability (BLR) performance improvement with the "ball catch" structure compared to a non-ball catch or planar structure for quad flat no-lead (QFN) packages.

Figure 6:
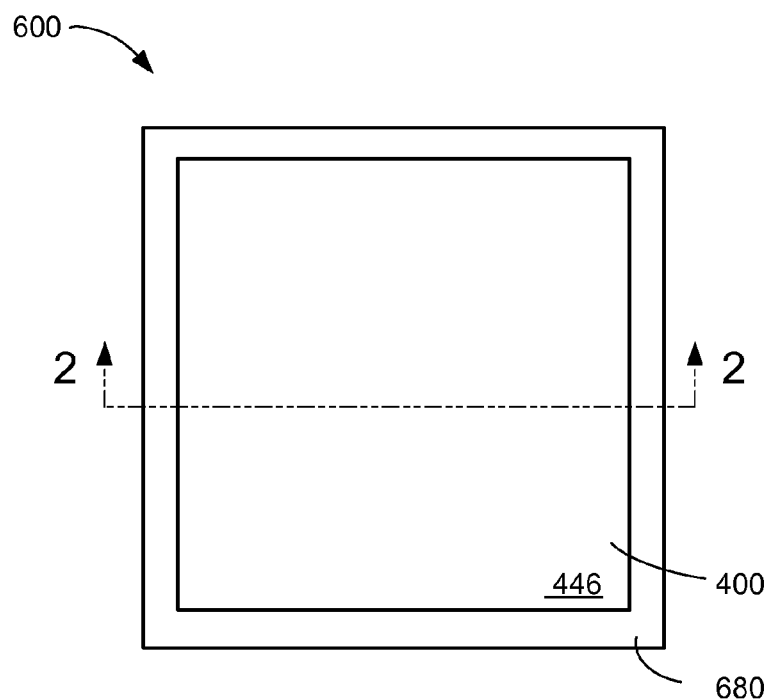
FIG. 6 is a top view on an integrated circuit packaging system in a fourth embodiment of the present invention

Referring now to FIG. 6, therein is shown a top view on an integrated circuit packaging system 600 in a fourth embodiment of the present invention. The top view depicts the encapsulation 446 of the integrated circuit packaging system 400 mounted over a base carrier 680.

The base carrier 680 is defined as a rigid structure that provides support and connectivity for mounting other components and devices. As an example, the base carrier 680 can be a laminated substrate or a ceramic substrate. As a further example, the laminated substrate can be a layered substrate having vias and intermetallic layers. As a specific example, the base carrier 680 can be a printed circuit board.

Figure 7:
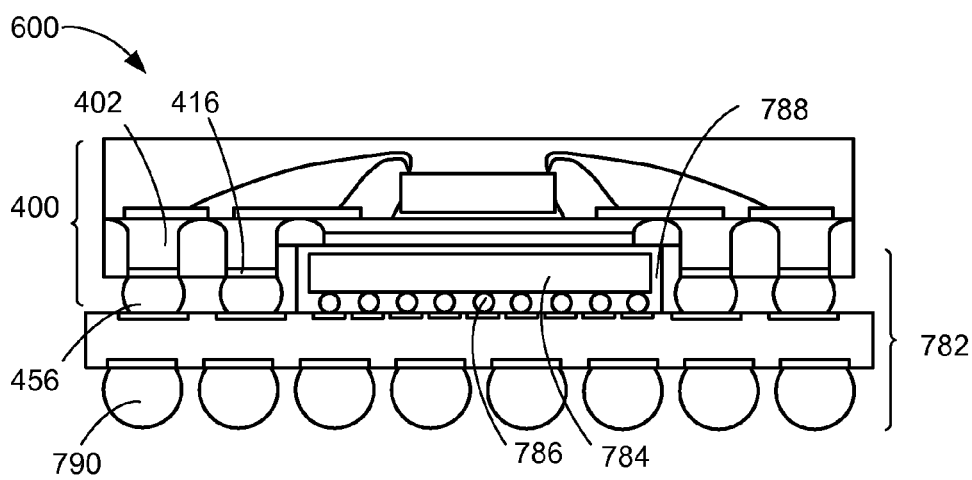
FIG. 7 is a cross-sectional view of the integrated circuit packaging system along line 7-7 of FIG. 6.

Referring now to FIG. 7, therein is shown a cross-sectional view of the integrated circuit packaging system 600 along line 7-7 of FIG. 6. The cross-sectional view depicts the integrated circuit packaging system 400 mounted over a base package 782. The base package 782 is defined as a packaged circuit device. The base package 782 can include the base carrier 680, a base circuit device 784, base device connectors 786, and a base device cover 788.

The base circuit device 784 can be mounted on the base carrier 680. The base circuit device 784 is defined as an active device having active circuitry (not shown) fabricated thereon. As an example, the base circuit device 784 can be a semiconductor die, a thin semiconductor die, a wirebond die, or a flip chip.

The base circuit device 784 can be attached to the base carrier 680 with base device connectors 786. The base device connectors 786 are defined as electrically conductive material for providing electrical connection between devices. As an example, the base device connectors 786 can be solder balls, solder bumps, conductive bumps, or conductive posts.

The base device cover 788 can be on the base circuit device 784. The base device cover 788 is defined as a protective cover that has electric and environmental insulating properties providing a hermetic seal. As an example, the base device cover 788 can be a molded encapsulation material, such as epoxy molding compound or ceramic material. The base device cover 788 can surround the base circuit device 784, the base device connectors 786, and fill the space between the base circuit device 784 and the base carrier 680.

Base external interconnects 790 can be attached to the side of the base carrier 680 facing away from the base circuit device 784. The base external interconnects 790 are defined as electrically conductive material for providing electrical connection between devices. As an example, the base device connectors 786 can be solder balls, solder bumps, conductive bumps, or conductive posts. The base external interconnects 790 can connect the base package 782 to the next system level down (not shown).

The integrated circuit packaging system 400 can be mounted on the base package 782 with the base device cover 788 and the base circuit device 784 in the cavity 460 of the insulation layer 450. The external connector 456 can connect the base carrier 680 and the peripheral lead conductive plate 416 of the peripheral lead 402.

It has been discovered that the cavity 460 provides a space for the base circuit device 784 and the base device cover 788 thus reducing the overall height of the integrated circuit packaging system 600.

Figure 8:
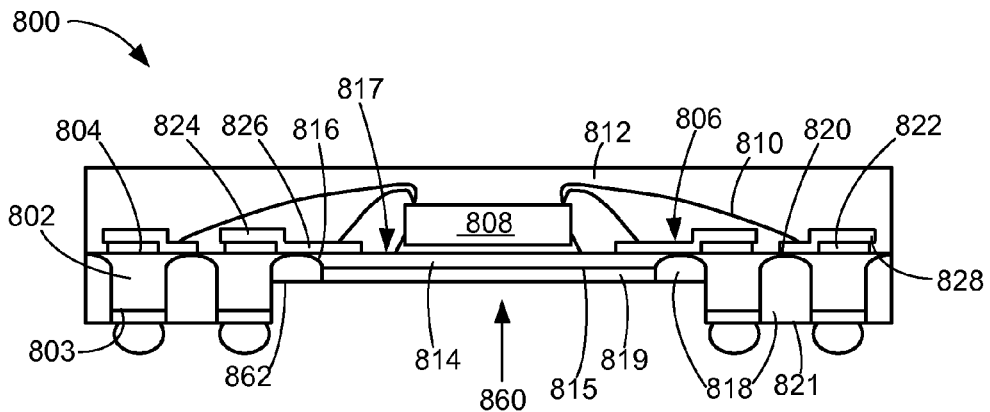
FIG. 8 is a cross-sectional view of an integrated circuit packaging system as exemplified by line 1-1 of FIG. 2 in a fifth embodiment of the present invention.

Referring now to FIG. 8 therein is shown a cross-sectional view of an integrated circuit packaging system 800 as exemplified by line 1-1 of FIG. 2 in a fifth embodiment of the present invention. The integrated circuit packaging system 800 can include a quad flat no-lead (QFN) array.

The integrated circuit packaging system 800 can include a top plate with routed circuit and an optional overhang. The integrated circuit packaging system 800 can include a two-copper (Cu) layer including a copper (Cu) cap.

In a manner similar to the integrated circuit packaging system 400 of FIG. 4, the integrated circuit packaging system 800 includes a peripheral lead 802 having a peripheral lead bottom side 803 and a peripheral lead top side 804 opposite the peripheral lead bottom side 803. The peripheral lead bottom side 803 and the peripheral lead top side 804 are defined as the bottom and top side, respectively, of the peripheral lead 802.

In a manner similar to the integrated circuit packaging system 400, the integrated circuit packaging system 800 also includes a first top distribution layer 806, an integrated circuit 808, an internal connector 810, and an encapsulation 812.

In a manner similar to the integrated circuit packaging system 400, the integrated circuit packaging system 800 includes a package paddle 814 having a paddle horizontal ridge 816. The package paddle 814 can include a paddle bottom side 815 and a paddle top side 817 opposite the paddle bottom side 815. The paddle bottom side 815 and the paddle top side 817 are defined as bottom and top sides of the package paddle 814.

The package paddle 814 can include a paddle conductive plate 819, which is defined as an attachment site providing electrical connection to the package paddle 814. The paddle conductive plate 819 can function as an etching protection layer, an adhesion layer, a buffer diffusion barrier layer, a wet-enhancing layer, or a combination thereof. The paddle conductive plate 819 can be formed at the paddle bottom side 815.

In a manner similar to the integrated circuit packaging system 400, the integrated circuit packaging system 800 also includes an insulation layer 818. The insulation layer 818 can include an insulation top side 820 and an insulation bottom side 821 opposite the insulation top side 820.

The integrated circuit packaging system 800 can include a conductive cap 822, which is defined as a layer formed directly on the peripheral lead top side 804. For example, the conductive cap 822 can represent a second copper (Cu) layer used as copper (Cu) build up for mold interlocking.

The conductive cap 822 can be formed with an electrically conductive material including copper (Cu) or any other metallic material. The conductive cap 822 provides a raise structure above the peripheral lead top side 804 so that a peripheral distribution step portion 824 of the first top distribution layer 806 can be formed above the peripheral lead top side 804.

The first top distribution layer 806 can include a peripheral distribution base portion 826 integrally formed with the peripheral distribution step portion 824. The peripheral distribution base portion 826 is below the peripheral distribution step portion 824. The insulation layer 818 can be directly on a portion of a bottom extent of the peripheral distribution base portion 826 to protect the first top distribution layer 806.

The peripheral distribution base portion 826 can be over the package paddle 814 and the insulation layer 818. The peripheral distribution base portion 826 can be directly on the paddle horizontal ridge 816 and the insulation top side 820.

The peripheral distribution step portion 824 can be directly on the conductive cap 822. The peripheral distribution step portion 824 can include a length longer than a length of the conductive cap 822 such that the first top distribution layer 806 can include a peripheral distribution overhang 828 that laterally extends beyond a non-horizontal side of the conductive cap 822.

The encapsulation 812 can be formed over the peripheral lead top side 804, the first top distribution layer 806, and the conductive cap 822. The encapsulation 812 can be formed directly under a bottom extent of the peripheral distribution overhang 828.

The integrated circuit packaging system 800 can include a copper (Cu) build up (Cap) structure that has been plated with routing on top, as shown with the conductive cap 822 and the first top distribution layer 806. Such structure provides not only routing of signals that enable shorter wire bonds but also mold encapsulation interlock.

The insulation layer 818 can include a cavity 860 can be along the insulation bottom side 821. The cavity 860 can be in the portion of the insulation layer 818 directly below the integrated circuit 808. The cavity 860 can be between the peripheral lead 802 and another of the peripheral lead 802 both adjacent to the integrated circuit 808.

The cavity 860 can have a recessed surface 862. The vertical distance between the recessed surface 862 and the insulation top side 820 is less than the distance between the insulation bottom side 821 and the insulation top side 820.

The package paddle 814 can be exposed in the cavity 860 along the recessed surface 862. The recessed surface 862 can be co-planar with the side of the paddle conductive plate 819 facing away from the paddle bottom side 815.

The cavity 860 can have a horizontal dimension and vertical dimension sized to receive a packaged device. For example, the distance between the recessed surface 862 of the cavity 860 and the insulation bottom side 821 can be similar or greater than the vertical length or height of a packaged device.

It has been discovered that the first top distribution layer 806 having the peripheral distribution step portion 824 extending beyond the conductive cap 822 forming the peripheral distribution overhang 828 significantly improves reliability with the encapsulation 812 formed directly under the bottom extent of the peripheral distribution overhang 828 providing mold encapsulation interlock.

It has further been discovered that the cavity 860 in the insulation layer 818 reduces height of stacked package systems by providing a space for other devices.

It has also been discovered that the cavity 860 provides reduced thickness of the insulation layer 818 for facilitating heat transfer of the integrated circuit 808 to the external environment.

Figure 9:
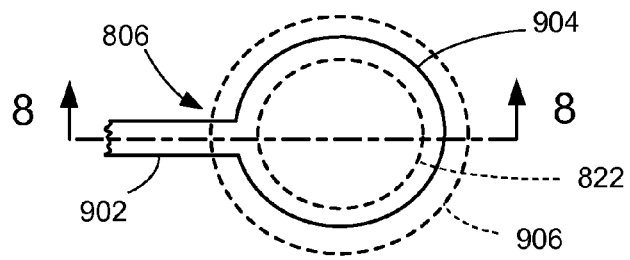
FIG. 9 is a top view of a portion of the first top distribution layer.

Referring now to FIG. 9, therein is shown a top view of a portion of the first top distribution layer 806. The first top distribution layer 806 can include a first top conductive trace 902 connected to a first top terminal 904. The first top terminal 904 can include a surface area smaller than a surface area of a peripheral lead conductive plate 906 of the peripheral lead 802 of FIG. 8. The first top terminal 904 can include a surface area larger than a surface area of the conductive cap 822.

The first top distribution layer 806 can include the first top terminal 904 and a first top conductive trace 902 formed as a single integral structure with a common electrically conductive material. The first top conductive trace 902 can be electrically connected to the first top terminal 904.

Figure 10:
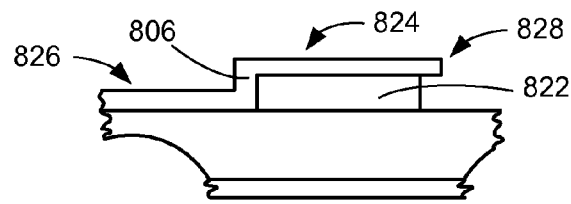
FIG. 10 is a cross-sectional view of the first top distribution layer taken along line 9-9 of FIG. 10.

Referring now to FIG. 10, therein is shown a cross-sectional view of the first top distribution layer 806 taken along line 9-9 of FIG. 10. The first top distribution layer 806 can include the peripheral distribution base portion 826 integrally formed with the peripheral distribution step portion 824. The peripheral distribution base portion 826 can include the first top conductive trace 902 of FIG. 9.

The peripheral distribution step portion 824 can include the first top terminal 904 of FIG. 9. The peripheral distribution step portion 824 can be directly on the conductive cap 822. The peripheral distribution step portion 824 can include a length longer than a length of the conductive cap 822 such that the first top distribution layer 806 can include the peripheral distribution overhang 828 that laterally extends beyond a non-horizontal side of the conductive cap 822.

Figure 11:
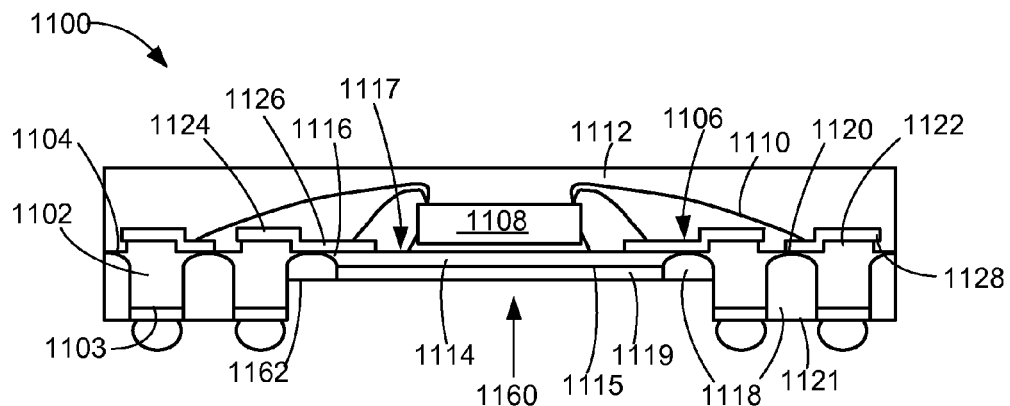
FIG. 11 is a cross-sectional view of an integrated circuit packaging system as exemplified by line 1-1 of FIG. 2 in a sixth embodiment of the present invention.

Referring now to FIG. 11, therein is shown a cross-sectional view of an integrated circuit packaging system 1100 as exemplified by line 1-1 of FIG. 2 in a sixth embodiment of the present invention. The integrated circuit packaging system 1100 can include a quad flat no-lead (QFN) array.

In a manner similar to the integrated circuit packaging system 400 of FIG. 4, the integrated circuit packaging system 1100 includes a peripheral lead 1102 having a peripheral lead bottom side 1103 and a peripheral lead top side 1104 opposite the peripheral lead bottom side 1103. The peripheral lead bottom side 1103 and the peripheral lead top side 1104 are defined as the bottom and top side, respectively, of the peripheral lead 1102.

In a manner similar to the integrated circuit packaging system 400, the integrated circuit packaging system 1100 also includes a first top distribution layer 1106, an integrated circuit 1108, an internal connector 1110, and an encapsulation 1112.

In a manner similar to the integrated circuit packaging system 400, the integrated circuit packaging system 1100 includes a package paddle 1114 having a paddle horizontal ridge 1116. The package paddle 1114 can include a paddle bottom side 1115 and a paddle top side 1117 opposite the paddle bottom side 1115. The paddle bottom side 1115 and the paddle top side 1117 are defined as bottom and top sides of the package paddle 1114.

The package paddle 1114 can include a paddle conductive plate 1119, which is defined as an attachment site providing electrical connection to the package paddle 1114. The paddle conductive plate 1119 can function as an etching protection layer, an adhesion layer, a buffer diffusion barrier layer, a wet-enhancing layer, or a combination thereof. The paddle conductive plate 1119 can be formed at the paddle bottom side 1115.

In a manner similar to the integrated circuit packaging system 400, the integrated circuit packaging system 1100 also includes an insulation layer 1118. The insulation layer 1118 can include an insulation top side 1120 and an insulation bottom side 1121 opposite the insulation top side 1120.

The peripheral lead 1102 can include an integrally formed structure with a peripheral lead step portion 1122, which is defined as a layer formed over or vertically protruding from the peripheral lead top side 1104. For example, the peripheral lead step portion 1122 can represent a copper (Cu) post or a portion of a base leadframe copper (Cu). Also for example, the peripheral lead step portion 1122 can include a thick copper (Cu) with top partial etching.

The peripheral lead step portion 1122 can be formed with an electrically conductive material including copper (Cu) or any other metallic material. The peripheral lead step portion 1122 provides a raise structure above the peripheral lead top side 1104 so that a peripheral distribution step portion 1124 of the first top distribution layer 1106 can be formed above the peripheral lead top side 1104.

The first top distribution layer 1106 can include a peripheral distribution base portion 1126 integrally formed with the peripheral distribution step portion 1124. The peripheral distribution base portion 1126 is below the peripheral distribution step portion 1124. The insulation layer 1118 can be directly on a portion of a bottom extent of the peripheral distribution base portion 1126 to protect the first top distribution layer 1106.

The peripheral distribution base portion 1126 can be over the package paddle 1114 and the insulation layer 1118. The peripheral distribution base portion 1126 can be directly on the paddle horizontal ridge 1116 and the insulation top side 1120.

The peripheral distribution step portion 1124 can be directly on the peripheral lead step portion 1122. The peripheral distribution step portion 1124 can include a length longer than a length of the peripheral lead step portion 1122 such that the first top distribution layer 1106 can include a peripheral distribution overhang 1128 that laterally extends beyond a non-horizontal side of the peripheral lead step portion 1122.

The encapsulation 1112 can be formed over the peripheral lead top side 1104, the first top distribution layer 1106, and the peripheral lead step portion 1122. The encapsulation 1112 can be formed directly under a bottom extent of the peripheral distribution overhang 1128.

The integrated circuit packaging system 1100 can include partial copper (Cu) etching structure that has been plated with routing on top, as shown with the peripheral lead step portion 1122 and the first top distribution layer 1106. Such structure provides not only routing of signals that enable shorter wire bonds but mold encapsulation interlock as well.

The insulation layer 1118 can include a cavity 1160 can be along the insulation bottom side 1121. The cavity 1160 can be in the portion of the insulation layer 1118 directly below the integrated circuit 1108. The cavity 1160 can be between the peripheral lead 1102 and another of the peripheral lead 1102 both adjacent to the integrated circuit 1108.

The cavity 1160 can have a recessed surface 1162. The vertical distance between the recessed surface 1162 and the insulation top side 1120 is less than the distance between the insulation bottom side 1121 and the insulation top side 1120.

The package paddle 1114 can be exposed in the cavity 1160 along the recessed surface 1162. The recessed surface 1162 can be co-planar with the side of the paddle conductive plate 1119 facing away from the paddle bottom side 1115.

The cavity 1160 can have a horizontal dimension and vertical dimension sized to receive a packaged device. For example, the distance between the recessed surface 1162 of the cavity 1160 and the insulation bottom side 1121 can be similar or greater than the vertical length or height of a packaged device.

It has been discovered that the first top distribution layer 1106 having the peripheral distribution step portion 1124 extending beyond the peripheral lead step portion 1122 forming the peripheral distribution overhang 1128 significantly improves reliability with the encapsulation 1112 formed directly under the bottom extent of the peripheral distribution overhang 1128 providing mold encapsulation interlock.

It has further been discovered that the cavity 1160 in the insulation layer 1118 reduces height of stacked package systems by providing a space for other devices.

It has also been discovered that the cavity 1160 provides reduced thickness of the insulation layer 1118 for facilitating heat transfer of the integrated circuit 1108 to the external environment.

Figure 12:
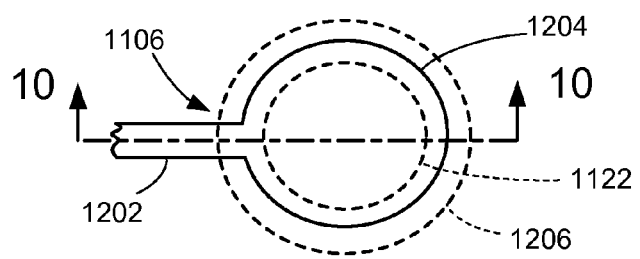
FIG. 12 is a top view of a portion of the first top distribution layer.

Referring now to FIG. 12, therein is shown a top view of a portion of the first top distribution layer 1106. The first top distribution layer 1106 can include a first top conductive trace 1202 connected to a first top terminal 1204. The first top terminal 1204 can include a surface area smaller than a surface area of a peripheral lead conductive plate 1206 of the peripheral lead 1102 of FIG. 11. The first top terminal 1204 can include a surface area larger than a surface area of the peripheral lead step portion 1122.

The first top distribution layer 1106 can include the first top terminal 1204 and the first top conductive trace 1202 formed as a single integral structure with a common electrically conductive material. The first top conductive trace 1202 can be electrically connected to the first top terminal 1204.

Figure 13:
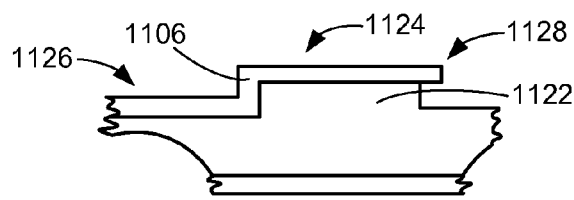
FIG. 13 is a cross-sectional view of the first top distribution layer taken along line 13-13 of FIG. 12.

Referring now to FIG. 13, therein is shown a cross-sectional view of the first top distribution layer 1206 taken along line 13-13 of FIG. 12. The first top distribution layer 1106 can include the peripheral distribution base portion 1126 integrally formed with the peripheral distribution step portion 1124. The peripheral distribution base portion 1126 can include the first top conductive trace 1202 of FIG. 12.

The peripheral distribution step portion 1124 can include the first top terminal 1204 of FIG. 12. The peripheral distribution step portion 1124 can be directly on the peripheral lead step portion 1122. The peripheral distribution step portion 1124 can include a length longer than a length of the peripheral lead step portion 1122 such that the first top distribution layer 1106 can include the peripheral distribution overhang 1128 that laterally extends beyond a non-horizontal side of the peripheral lead step portion 1122.

Figure 14:
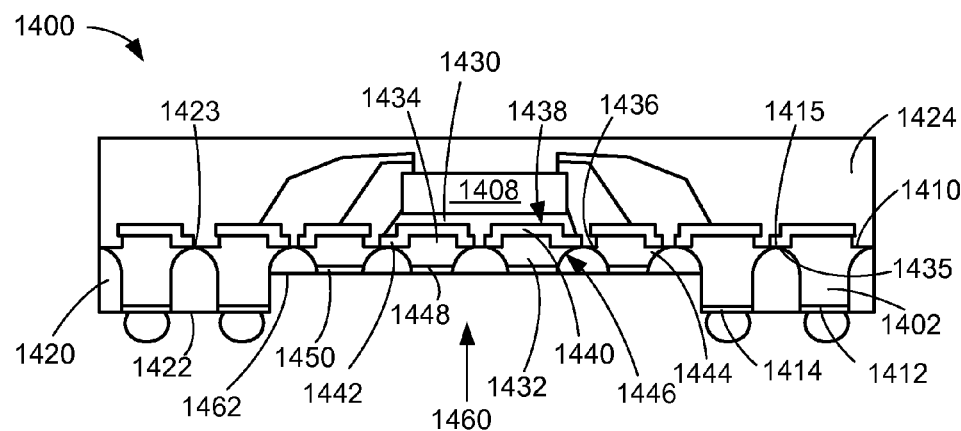
FIG. 14 is a cross-sectional view of an integrated circuit packaging system taken along line 14-14 of FIG. 15 in a seventh embodiment of the present invention.
Figure 15:
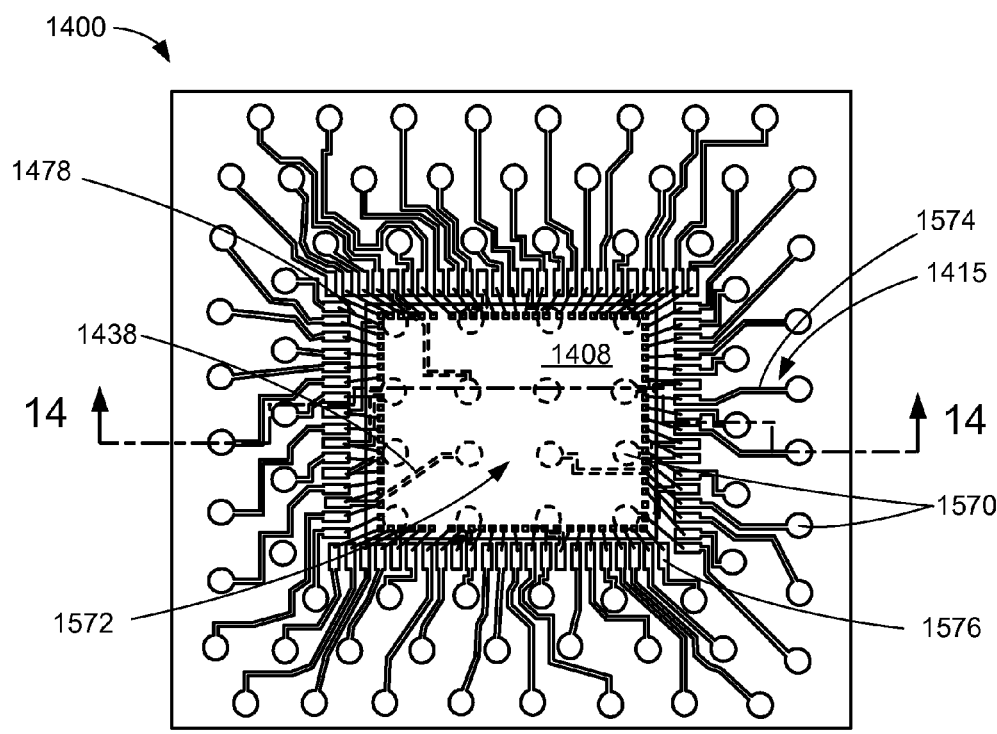
FIG. 15 is an exemplary top plan view of the integrated circuit packaging system.

Referring now to FIG. 14, therein is shown a cross-sectional view of an integrated circuit packaging system 1400 taken along line 14-14 of FIG. 15 in a seventh embodiment of the present invention. The integrated circuit packaging system 1400 can include a quad flat no-lead (QFN) array.

The integrated circuit packaging system 1400 can include an integrated circuit 1408. The integrated circuit 1408 is defined as a semiconductor device. For example, the integrated circuit 1408 can include a semiconductor device including a wirebond chip, a flip chip, or a silicon (Si) die. Optionally, the integrated circuit packaging system 1400 can include the integrated circuit 1408 in a stacked configuration having more than one of the integrated circuit 1408, such as a wirebond die stacked or mounted on a flip-chip die.

In a manner similar to the integrated circuit packaging system 400, the integrated circuit packaging system 1400 includes an attach layer 1430, which is defined as a die attach material or an adhesive material. The integrated circuit packaging system 1400 can include a central lead 1432, which is defined as a structure that provides connectivity for electrical signals or electrical potential levels between the integrated circuit packaging system 1400 and an external system (not shown).

The integrated circuit packaging system 1400 can include a full array of a plurality of a peripheral lead 1402 and the central lead 1432. It is understood that previously described embodiments can include a full array of a plurality of, for example, the peripheral lead 1402, the central lead 1432, or a combination thereof.

The integrated circuit packaging system 1400 can include a plurality of the central lead 1432 surrounded by or adjacent to a plurality of the peripheral lead 1402. The peripheral lead 1402 can include a peripheral lead bottom side 1412 and a peripheral lead top side 1410 opposite the peripheral lead bottom side 1412. The peripheral lead bottom side 1412 and the peripheral lead top side 1410 are defined as bottom and top sides, respectively, of the peripheral lead 1402.

The peripheral lead 1402 can include a peripheral lead conductive plate 1414, which is defined as an attachment site providing electrical connection to the peripheral lead 1402. The peripheral lead conductive plate 1414 can function as an etching protection layer, an adhesion layer, a buffer diffusion barrier layer, a wet-enhancing layer, or a combination thereof.

The central lead 1432 can include a central lead bottom side 1448 and a central lead top side 1436 opposite the central lead bottom side 1448. The central lead bottom side 1448 and the peripheral lead central lead top side 1436 are defined as bottom and top sides, respectively, of the central lead 1432. The vertical distance between the central lead top side 1436 and the central lead bottom side 1448 is less than the distance between the peripheral lead top side 1410 and the peripheral lead bottom side 1412.

The central lead 1432 can include a central lead step portion 1434, which is defined as an elevated portion of the central lead 1432. The central lead step portion 1434 can extend vertically above the central lead top side 1436.

The integrated circuit packaging system 1400 can include a central top distribution layer 1438, which is defined as a structure that provides electrical connectivity between the integrated circuit 1408 and the central lead 1432. The central top distribution layer 1438 can include a central distribution step portion 1440 above a central distribution base portion 1442. The central distribution step portion 1440 can be directly on the central lead step portion 1434.

The central distribution base portion 1442 can be over the central lead top side 1436 and directly on a central lead horizontal ridge 1444, which is defined as an end of the central lead 1432 that horizontally protrudes from a central lead non-horizontal side 1446 of the central lead 1432. The central lead non-horizontal side 1446 extends between the central lead bottom side 1448 and the central lead top side 1436.

The central lead 1432 can include a central lead conductive plate 1450, which is defined as an attachment site providing electrical connection to the central lead 1432. The central lead conductive plate 1450 can be formed at the central lead bottom side 1448. A portion of a bottom extent of the central lead conductive plate 1450 can represent the central lead bottom side 1448.

The central lead conductive plate 1450 can be formed at the central lead bottom side 1448. As an example, the central lead conductive plate 1450 can be formed with bottom plating process on a terminal. The central lead conductive plate 1450 can be formed with a conductive material, such as gold, palladium, nickel, silver, tin, an alloy, a combination thereof. The central lead conductive plate 1450 can be formed from a material different than the material used to form the central lead 1432.

At least a portion of the central lead 1432 can be directly under the integrated circuit 1408. The integrated circuit 1408 can be over the central top distribution layer 1436. The integrated circuit 1408 can be mounted on the central lead top side 1436 with the attach layer 1430.

The integrated circuit packaging system 1400 can include a first top distribution layer 1415, which is defined as a structure that provides electrical connectivity between a semiconductor device and the peripheral lead 1402. The first top distribution layer 1415 routes electrical connection or redistributes electrical signals from an integrated circuit 1408 to the peripheral lead 1402.

The integrated circuit packaging system 1400 can include a plurality of the first top distribution layer 1415. For example, the first top distribution layer 1415 can represent an electrical connector including a top plate with a routed circuit or a distribution layer (RDL). Also for example, the first top distribution layer 1415 can include a flat top.

The first top distribution layer 1415 can be electrically connected to the peripheral lead 1402. The first top distribution layer 1415 can be formed directly on a portion of the peripheral lead top side 1410.

The integrated circuit packaging system 1400 can include an insulation layer 1420, which is defined as a protection layer that protects a portion of a distribution layer bottom extent 1435 of the first top distribution layer 1415. The insulation layer 1420 can include an insulation material including a passivation, a solder resist, or an adhesive. For example, the insulation layer 1420 can be a viscous material that hardens when cured, or a material different from the encapsulation 1424. The insulation layer 1420 can include an insulation bottom side 1422 and an insulation top side 1423 opposite the insulation bottom side 1422.

The insulation layer 1420 can be formed or applied directly on portions of the peripheral lead 1402, the central lead 1432, and the central top distribution layer 1438. The insulation layer 1420 can be formed or applied directly on the central lead non-horizontal side 1446 and the bottom extent of the central top distribution layer 1438.

The insulation layer 1420 can electrically isolate the central lead 1432 from another of the central lead 1432 or the peripheral lead 1402 from the central lead 1432. The insulation layer 1420 can be formed surrounding the peripheral lead 1402 and the central lead 1432.

A plane of the insulation bottom side 1422 can be coplanar with any one of planes of the peripheral lead bottom side 1412. For example, a plane of the insulation bottom side 1422 can be coplanar with any one of planes of a bottom extent of the peripheral lead conductive plate 1414.

The insulation layer 1420 can include a cavity 1460 along the insulation bottom side 1422. The cavity 1460 can be in the portion of the insulation layer 1420 directly below the integrated circuit 1408. The cavity 1460 can be between the peripheral lead 1402 and another of the peripheral lead 1402 both adjacent to the integrated circuit 1808.

The cavity 1460 can have a recessed surface 1462. The vertical distance between the recessed surface 1462 and the insulation top side 1423 is less than the distance between the insulation bottom side 1422 and the insulation top side 1423.

The central lead 1432 can be exposed in the cavity 1460 along the recessed surface 1462. The recessed surface 1462 can be co-planar with the side of the central lead conductive plate 1450 facing away from the central lead bottom side 1448.

The cavity 1460 can have a horizontal dimension and vertical dimension sized to receive a packaged device. For example, the distance between the recessed surface 1462 of the cavity 1460 and the insulation bottom side 1422 can be similar or greater than the vertical length or height of a packaged device.

The integrated circuit packaging system 1400 can include an encapsulation 1424, which is defined as a package cover of a semiconductor package to seal a semiconductor device providing mechanical and environmental protection. The encapsulation 1424 can be formed covering or over the peripheral lead top side 1410, the first top distribution layer 1415, the integrated circuit 1408, the attach layer 1430.

It has also been discovered that the central top distribution layer 1438 having the central distribution step portion 1440 above the central distribution base portion 1442 improves reliability with more surface area provided by the central top distribution layer 1438 for the attach layer 1430 to attach thereto and with improved interlocking provided by the central distribution base portion 1442 preventing lead pullout.

It has further been discovered that the cavity 1460 in the insulation layer 1420 reduces height of stacked package systems by providing a space for other devices.

It has also been discovered that the cavity 1460 provides reduced thickness of the insulation layer 1420 for facilitating heat transfer of the integrated circuit 1408 to the external environment.

It has yet further been discovered that the central lead 1432 provides increased connectivity by increasing the number of connection sites for the integrated circuit packaging system 1400.

Referring now to FIG. 15, therein is shown an exemplary top plan view of the integrated circuit packaging system 1400. The first exemplary top plan view is shown without the encapsulation 1424 of FIG. 14.

The first top distribution layer 1415 and the central top distribution layer 1438 can include a first top terminal 1570, which is defined as an electrical connection site providing electrical connectivity to the first top distribution layer 1415. The first top terminal 1570 can be directly on the peripheral lead top side 1410 of FIG. 14, the central lead top side 1436 of FIG. 11, or a combination thereof.

An array of a plurality of the first top terminal 1570 can be distributed across surfaces at the peripheral lead top side 1410, the central lead top side 1436, or a combination thereof. The array is defined as a physical arrangement or distribution of the plurality of the first top terminal 1570 over a surface area of the peripheral lead top side 1410 the central lead top side 1436, or a combination thereof. The array includes the plurality of the first top terminal 1570 that is fully populated, evenly spaced, or a combination thereof.

The array can be outside of a perimeter of the integrated circuit 1408. The array can also be within the perimeter of the integrated circuit 1408 such that a central portion 1572 of the integrated circuit 1408 can be directly over the array of the plurality of the first top terminal 1570. The central portion 1572 is defined as a portion of the integrated circuit 1408 at a center of the integrated circuit 1408 and away from a perimeter of the integrated circuit 1408.

The first top distribution layer 1415 and the central top distribution layer 1438 can include a first top conductive trace 1574, which is defined as a conductive connector that provides or routes electrical connection between the first top terminal 1570 and a first top finger 1576. The first top finger 1576 is defined as an electrical connection site for an internal connector 1478 to attach to the first top distribution layer 1415. The internal connector 1478 is defined as which is defined as an electrically conductive connector.

The first top conductive trace 1574 can be directly on portions of the peripheral lead 1402 of FIG. 11 and the central lead 1432 of FIG. 11. For example, the first top conductive trace 1574 can include an electrical connector including a distribution trace or a routed layer.

An array of a plurality of the first top finger 1576 can be formed adjacent to or surrounding a perimeter of the integrated circuit 1408. The array is defined as a physical arrangement or distribution of the plurality of the first top finger 1576. The array includes a row of the plurality of the first top finger 1576. The array can include the plurality of the first top finger 1576 that is evenly spaced.

The attach layer 1430 of FIG. 14 can be directly on a portion of the first top distribution layer 1415 that is under the integrated circuit 1408. For example, the attach layer 1440 can be directly on a portion of the first top conductive trace 1574 and the first top terminal 1570 that are directly under the integrated circuit 1408.

For illustrative purposes, the first top terminal 1570 and the first top finger 1576 are shown having circular and rectangular shapes, respectively, although it is understood that the first top terminal 1570 and the first top finger 1576 can include any shapes. For example, the first top finger 1576 can include a circular shape.

It has been discovered that the integrated circuit 1408 having the central portion 1572 directly over an array of a plurality of the first top terminal 1570 improves speed performance with less routing congestion due to an increase of routing area.

Figure 16:
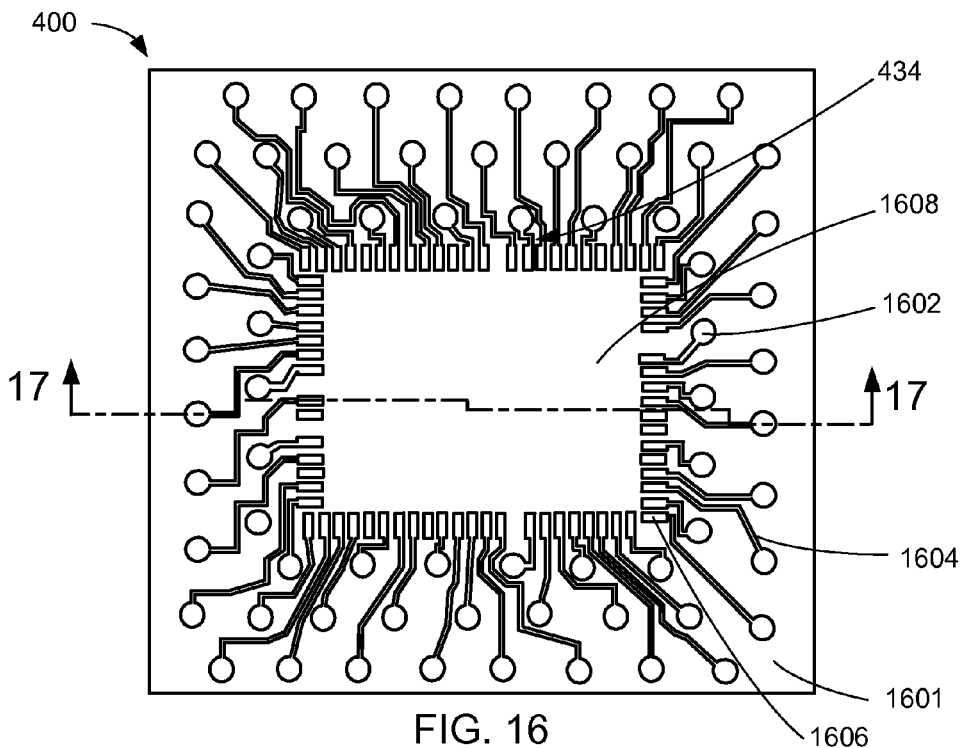
FIG. 16 is a top view of the structure of FIG. 4 in a plating phase of manufacture.

Referring now to FIG. 16, therein is shown a top view of the structure of FIG. 4 in a plating phase of manufacture. The top view depicts the integrated circuit packaging system 400 having a leadframe 1601, which is defined as a structure for mounting and connecting a semiconductor device thereto. The leadframe 1601 can be formed with an electrically conductive material including copper (Cu) or any other metallic material.

The first top distribution layer 434 can be formed on the leadframe 1601. The first top distribution layer 434 can include a first top terminal 1602, which is defined as an electrical connection site providing electrical connectivity to the first top distribution layer 434.

An array of a plurality of the first top terminal 1602 can be distributed across the surface of the leadframe 1601. The array is defined as a physical arrangement or distribution of the plurality of the first top terminal 1602 over a surface area of the leadframe 1601. The array includes the plurality of the first top terminal 1602 that is evenly spaced.

The first top distribution layer 434 can include a first top conductive trace 1604, which is defined as a conductive connector that provides or routes electrical connection between the first top terminal 1602 and a first top finger 1606. For example, the first top conductive trace 1604 can include an electrical connector including a distribution trace or a routed layer.

The first top finger 1606 is defined as an electrical connection site for the attachment of a device to the first top distribution layer 434. An array of a plurality of the first top finger 1606 can be formed around a mounting surface 1608 of the leadframe 1601. The mounting surface 1608 is defined as an area for mounting a device, such as the integrated circuit 436 of FIG. 4.

The array is defined as a physical arrangement or distribution of the plurality of the first top finger 1606. The array includes a row of the plurality of the first top finger 1606. The array can include the plurality of the first top finger 1606 that is evenly spaced.

For illustrative purposes, the first top terminal 1602 and the first top finger 1606 are shown having circular and rectangular shapes, respectively, although it is understood that the first top terminal 1602 and the first top finger 1606 can include any shapes. For example, the first top finger 1606 can include a circular shape.

The first top distribution layer 434, the first top terminal 1602, and the first top finger 1606 can be formed with a number of layers. The first top distribution layer 434, the first top terminal 1602, and the first top finger 1606 can be formed with a distribution layer conductive material, which is defined as an electrically conductive material including a metallic material or a metal alloy. For example, the distribution layer conductive material can include nickel (Ni), gold (Au), gold (Au) alloy, silver (Ag), a metal alloy, or a combination thereof.

As a specific example, the distribution layer conductive material can optionally include copper (Cu) or palladium (Pd). As another specific example, the distribution layer conductive material can include a seven-layer combination of gold (Au) (or gold (Au) alloy), palladium (Pd), nickel (Ni), copper (Cu), nickel (Ni), palladium (Pd), and gold (Au) (or gold (Au) alloy). As another specific example, the first top distribution layer 434 can include a five-layer combination of gold (Au) (or gold (Au) alloy), palladium (Pd), nickel (Ni), copper (Cu), and silver (Ag) with silver (Ag) as an alternative to three layers of nickel (Ni), palladium (Pd), and gold (Au) (or gold (Au) alloy) in the previous example.

As an example, the first top distribution layer 434, the first top terminal 1602, and the first top finger 1606 can be formed with a plating process. As another example, the first top distribution layer 434 can include a structure of a build-up pre plated frame (PPF).

Figure 17:
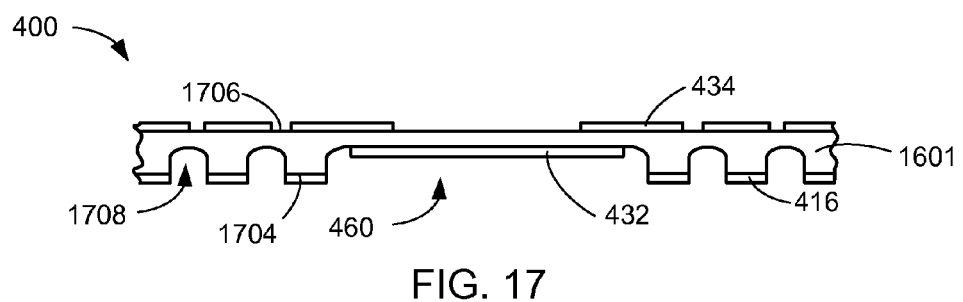
FIG. 17 is a cross-sectional view of the leadframe of FIG. 16.

Referring now to FIG. 17, therein is shown a cross-sectional view of the leadframe 1601 of FIG. 16. The leadframe 1601 can include a leadframe bottom side 1704 and a leadframe top side 1706 opposite the leadframe bottom side 1704.

A portion of the leadframe 1601 at the leadframe bottom side 1704 can be removed in a controlled manner to form a partially removed region 1708 and the cavity 460. The partially removed region 1708 and the cavity 460 can be formed with a removal process including etching. For example, the partially removed region 1708 and the cavity 460 can be formed with the leadframe 1601 half-etched.

As an example, the leadframe 1601 can be provided with a structure pre-etched at the leadframe bottom side 1704. As another example, the leadframe 1601 can be provided with a structure that is not pre-etched and will be etched in a subsequent phase.

The leadframe 1601 can include the peripheral lead conductive plate 416 formed at the leadframe bottom side 1704. Optionally, the leadframe 1601 can include the recess 558 of FIG. 5.

The peripheral lead conductive plate 416 can be formed with a number of layers. The peripheral lead conductive plate 416 can be formed with a lead plate conductive material, which is defined as an electrically conductive material including a metallic material or a metal alloy.

For example, the lead plate conductive material can include nickel (Ni), palladium (Pd), gold (Au), a metal alloy, or a combination thereof. For a specific example, the lead plate conductive material can include nickel-palladium (NiPd) or nickel-palladium-gold (NiPdAu).

As an example, the peripheral lead conductive plate 416 can be formed with a plating process. As another example, the peripheral lead conductive plate 416 can include a structure of a build-up pre plated frame (PPF).

The paddle conductive plate 432 can be formed in the cavity 460. The paddle conductive plate 432 can be formed on the surface of the leadframe 1601 in the cavity 460. Optionally, the leadframe 1601 can be provided without the paddle conductive plate 432 formed in the cavity 460. The paddle conductive plate 432 can be from a material and a process that is the same or similar to the material and process used to form the peripheral lead conductive plate 416.

The leadframe 1601 can include the first top distribution layer 434 formed directly on the leadframe top side 1706. The first top distribution layer 434 can be formed with a number of layers. The first top distribution layer 434 can be formed with a distribution layer conductive material, which is defined as an electrically conductive material including a metallic material or a metal alloy. For example, the distribution layer conductive material can include nickel (Ni), gold (Au), gold (Au) alloy, silver (Ag), a metal alloy, or a combination thereof.

As a specific example, the distribution layer conductive material can optionally include copper (Cu) or palladium (Pd). As another specific example, the distribution layer conductive material can include a seven-layer combination of gold (Au) (or gold (Au) alloy), palladium (Pd), nickel (Ni), copper (Cu), nickel (Ni), palladium (Pd), and gold (Au) (or gold (Au) alloy). As another specific example, the first top distribution layer 434 can include a five-layer combination of gold (Au) (or gold (Au) alloy), palladium (Pd), nickel (Ni), copper (Cu), and silver (Ag) with silver (Ag) as an alternative to three layers of nickel (Ni), palladium (Pd), and gold (Au) (or gold (Au) alloy) in the previous example.

As an example, the first top distribution layer 434 can be formed with a plating process. As another example, the first top distribution layer 434 can include a structure of a build-up pre plated frame (PPF).

In another embodiment, the first top distribution layer 434 can be formed with a step directly on a conductive layer on the leadframe top side 1706 similar to the conductive cap 822 of FIG. 8 or the peripheral lead step portion 1122 of FIG. 11. In a further embodiment, the first top distribution layer 434 can be formed with a step directly on and longer than a step of the leadframe 1601 forming an overhang similar to the peripheral distribution step portion 824 and the peripheral distribution overhang 828 of FIG. 8 and the peripheral distribution step portion 1124 and the peripheral distribution overhang 1128 of FIG. 11. In a yet further embodiment, a middle or central portion the leadframe 1601 can include an array of a plurality of the partially removed region 1708, an array of conductive plates at the leadframe bottom side 1704, an array of distribution layers at the leadframe top side 1706, or a combination thereof, similar to the central lead 1432 and the central lead conductive plate 1450 of FIG. 14.

Figure 18:
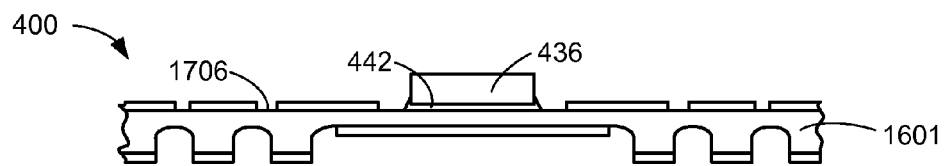
FIG. 18 is the structure of FIG. 17 in an attaching phase.

Referring now to FIG. 18, therein is shown the structure of FIG. 17 in an attaching phase. The integrated circuit packaging system 400 can include a die attach method to mount the integrated circuit 436 over the leadframe 1601. The integrated circuit 436 can be attached to the leadframe top side 1706 with the attach layer 442.

The integrated circuit 436 can include the inactive side 438 facing the leadframe top side 1706 for connection in a wirebond configuration. Alternatively, the integrated circuit 436 can be mounted with the inactive side 438 facing away from the leadframe top side 1706 for connection in a flip-chip configuration. As a further alternative, the integrated circuit 436 can include a stack of integrated circuit die in a wirebond and flip-chip combination.

Figure 19:
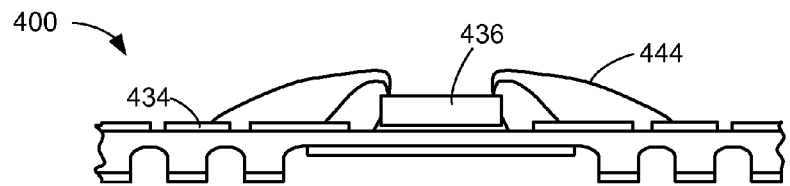
FIG. 19 is the structure of FIG. 18 in a connecting phase.

Referring now to FIG. 19, therein is shown the structure of FIG. 18 in a connecting phase. The integrated circuit packaging system 400 can include the internal connector 444 attached to the first top distribution layer 434 and the active side 440 of the integrated circuit 436. The internal connector 444 can be attached directly on the first top finger 1606 of FIG. 16.

For illustrative purposes, the internal connector 444 is shown as a bond wire, although it is understood that the internal connector 444 can include any other electrically conductive connectors. For example, the internal connector 444 can represent a conductive bump, a conductive stud, or a conductive paste. Also for example, the internal connector 444 can be formed with a conductive material including solder, a metal, or a metallic alloy.

Figure 20:
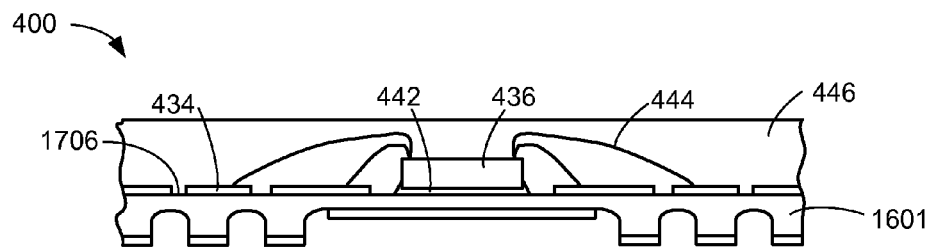
FIG. 20 is the structure of FIG. 19 in a molding phase.

Referring now to FIG. 20, therein is shown the structure of FIG. 19 in a molding phase. The integrated circuit packaging system 400 can include a molding process including liquid epoxy mold to form the encapsulation 446.

The encapsulation 446 can be molded over the leadframe 1601, the first top distribution layer 434, the integrated circuit 436, the attach layer 442, and the internal connector 444. The encapsulation 446 can be formed covering the leadframe top side 1706, the first top distribution layer 434, the integrated circuit 436, and the internal connector 444.

Figure 21:
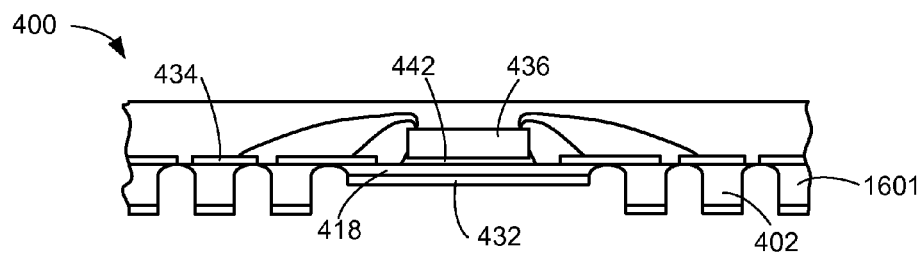
FIG. 21 is the structure of FIG. 20 in a removing phase.

Referring now to FIG. 21, therein is shown the structure of FIG. 20 in a removing phase. The integrated circuit packaging system 400 can include a removal process including etching in the removal phase. The removal process does not affect or remove the first top distribution layer 434. For example, the removal process can include a copper (Cu) etching.

A portion of the leadframe 1601 of FIG. 6 at the leadframe bottom side 1704 of FIG. 17 can be removed in the partially removed region 1708 of FIG. 17 forming the peripheral lead 402 and the package paddle 418. Such removal of the portion of the leadframe 1601 in the partially removed region 1708 can expose a bottom portion of the first top distribution layer 434. Alternatively, in the configuration of the leadframe 1601 without the paddle conductive plate 432, removal of the portion of the leadframe 1601 can expose the surface of the attach layer 442 facing away from the integrated circuit 436.

Figure 22:
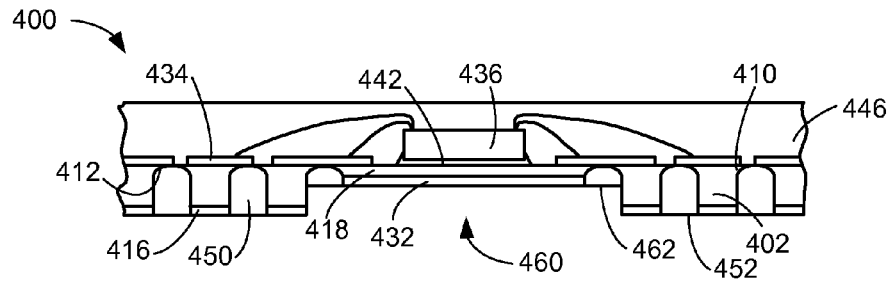
FIG. 22 is the structure of FIG. 21 in an applying phase.

Referring now to FIG. 22, therein is shown the structure of FIG. 21 in an applying phase. The integrated circuit packaging system 400 can include an application method including screen print, spin-coat, dispense, or capillary action. For example, the applying phase can include bottom trace protective layer, as shown with the insulation layer 450, after copper (Cu) etching process. As a further example, the insulation layer 450 can be applied with a stencil method in a thick configuration between the peripheral lead 402 and an adjacent one of the peripheral lead 402 and a thin configuration in the cavity 460 adjacent to the package paddle 418.

In yet a further example, the insulation layer 450 can be applied in two passes for a dual coating thickness. In this example, the first pass of the insulation layer 450 application can form the recessed surface 462 in the cavity 460 co-planar with the surface of the paddle conductive plate 432 facing away from the package paddle 418. To continue the example, the second pass can form the insulation bottom side 452 of the insulation layer 450 co-planar with the side of the peripheral lead conductive plate 416 facing away from the peripheral lead 402.

The integrated circuit packaging system 400 can include the insulation layer 450 applied or filled directly on portions of the peripheral lead 402, the package paddle 418, a horizontal extent of the paddle conductive plate 432, the first top distribution layer 434, and the encapsulation 446. For example, the insulation layer 450 can provide protection for an exposed circuit, as shown by the first top distribution layer 434 partially exposed after the removing phase, from environmental hazards and elements. Alternatively, in embodiments without the package paddle 418, as shown in the integrated circuit packaging system 100 of FIG. 1, the insulation layer 450 can be applied directly on the side of the attach layer 442 facing away from the integrated circuit 436.

The insulation layer 450 can protect bottom surfaces of the first top distribution layer 434. The insulation layer 450 can protect the first top terminal 1602 of FIG. 16.

The insulation layer 450 can electrically isolate the peripheral lead 402 and another of the peripheral lead 402. The insulation layer 450 can be formed surrounding the peripheral lead horizontal ridge 410. The insulation layer 450 can be formed directly on the peripheral lead ridge lower side 412.

In a subsequent phase, the integrated circuit packaging system 400 can include a package singulation process to produce individual units or packages of the integrated circuit packaging system 400. The package singulation process can include a mechanical or optical process.

Figure 23:
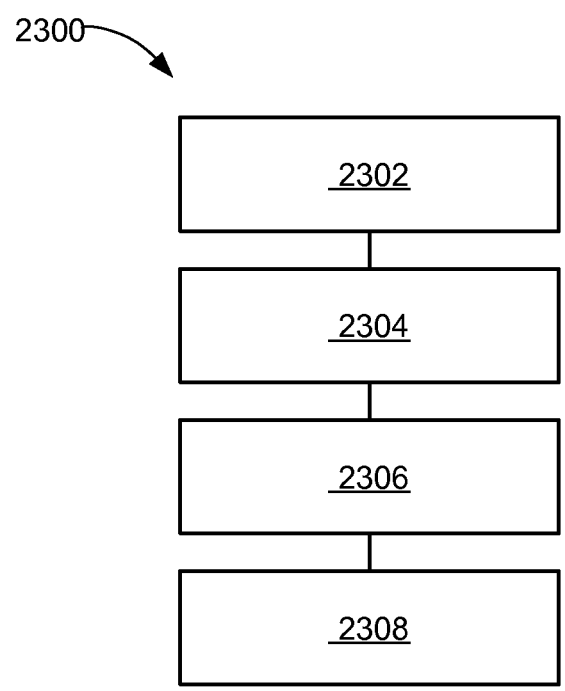
FIG. 23 is a flow chart of a method of manufacture of an integrated circuit packaging system in a further embodiment of the present invention.

Referring now to FIG. 23, therein is shown a flow chart of a method 2300 of manufacture of an integrated circuit packaging system in a further embodiment of the present invention. The method 2300 includes: forming a peripheral lead having a peripheral lead bottom side, a peripheral lead top side, a peripheral lead non-horizontal side, and a peripheral lead horizontal ridge protruding from the peripheral lead non-horizontal side in a block 2302; forming a first top distribution layer on the peripheral lead top side in a block 2304; connecting an integrated circuit to the first top distribution layer in a block 2306; and applying an insulation layer directly on a distribution layer bottom extent of the first top distribution layer and a peripheral lead ridge lower side of the peripheral lead horizontal ridge with a cavity in the portion of the insulation layer directly below the integrated circuit in a block 2308.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a peripheral lead having a peripheral lead bottom side, a peripheral lead top side, a peripheral lead non-horizontal side, and a peripheral lead horizontal ridge protruding from the peripheral lead non-horizontal side;
    forming a first top distribution layer on the peripheral lead top side;
    connecting an integrated circuit to the first top distribution layer; and
    applying an insulation layer directly on a distribution layer bottom extent of the first top distribution layer and a peripheral lead ridge lower side of the peripheral lead horizontal ridge with a cavity in the portion of the insulation layer directly below the integrated circuit.

2. The method as claimed in claim 1 further comprising:
forming a package paddle between the peripheral lead and another of the peripheral lead; and
wherein:
applying the insulation layer includes exposing the package paddle in the cavity.

3. The method as claimed in claim 1 further comprising forming a conductive cap directly on the peripheral lead top side.

4. The method as claimed in claim 1 wherein forming the peripheral lead includes forming a peripheral lead step portion protruding from the peripheral lead top side.

5. The method as claimed in claim 1 further comprising forming a central lead directly under the integrated circuit.

6. A method of manufacture of an integrated circuit packaging system comprising:
forming a peripheral lead having a peripheral lead bottom side, a peripheral lead top side, a peripheral lead conductive plate at the peripheral lead bottom side, and a peripheral lead non-horizontal side with a peripheral lead horizontal ridge protruding from the peripheral lead non-horizontal side;
forming a first top distribution layer on the peripheral lead top side;
connecting an integrated circuit to the first top distribution layer;
forming an encapsulation over the integrated circuit and the first top distribution layer; and
applying an insulation layer directly on a distribution layer bottom extent of the first top distribution layer and a peripheral lead ridge lower side of the peripheral lead horizontal ridge with a cavity in the portion of the insulation layer directly below the integrated circuit.

7. The method as claimed in claim 6 wherein forming the peripheral lead includes forming the peripheral lead having the peripheral lead conductive plate with a recess at the peripheral lead bottom side.

8. The method as claimed in claim 6 further comprising:
forming a conductive cap directly on the peripheral lead top side; and
wherein:
forming the first top distribution layer includes forming the first top distribution layer directly on the conductive cap and having a distribution layer conductive material.

9. The method as claimed in claim 6 wherein:
forming the peripheral lead includes forming a peripheral lead step portion protruding from the peripheral lead top side; and
wherein:
forming the first top distribution layer includes forming the first top distribution layer having a peripheral distribution step portion directly on the peripheral lead step portion.

10. The method as claimed in claim 6 further comprising forming a central lead directly under the integrated circuit and adjacent the peripheral lead.

11. An integrated circuit packaging system comprising:
a peripheral lead having a peripheral lead bottom side, a peripheral lead top side, a peripheral lead non-horizontal side, and a peripheral lead horizontal ridge protruding from the peripheral lead non-horizontal side;
a first top distribution layer on the peripheral lead top side;
an integrated circuit connected to the first top distribution layer; and
an insulation layer directly on a distribution layer bottom extent of the first top distribution layer and a peripheral lead ridge lower side of the peripheral lead horizontal ridge with a cavity in the portion of the insulation layer directly below the integrated circuit.

12. The system as claimed in claim 11 further comprising a package paddle between the peripheral lead and another of the peripheral lead with the package paddle exposed in the cavity.

13. The system as claimed in claim 11 further comprising a conductive cap directly on the peripheral lead top side.

14. The system as claimed in claim 11 wherein the peripheral lead includes a peripheral lead step portion protruding from the peripheral lead top side.

15. The system as claimed in claim 11 further comprising a central lead directly under the integrated circuit.

16. The system as claimed in claim 11 further comprising the peripheral lead having a recess at the peripheral lead bottom side.

17. The system as claimed in claim 16 wherein the peripheral lead includes the peripheral lead conductive plate with a recess at the peripheral lead bottom side and with a lead plate conductive material.

18. The system as claimed in claim 16 further comprising:
a conductive cap directly on the peripheral lead top side; and
wherein:
the first top distribution layer is directly on the conductive cap and has a distribution layer conductive material.

19. The system as claimed in claim 16 wherein:
the peripheral lead includes a peripheral lead step portion protruding from the peripheral lead top side; and
wherein:
the first top distribution layer includes a peripheral distribution step portion directly on the peripheral lead step portion.

20. The system as claimed in claim 16 further comprising a central lead directly under the integrated circuit and adjacent the peripheral lead.

* * * * *